United States Patent [19]
Tomita

[11] Patent Number: 5,937,338
[45] Date of Patent: *Aug. 10, 1999

[54] SCANNING RADIO RECEIVER

[75] Inventor: Nobuharu Tomita, Tokyo, Japan

[73] Assignee: General Research of Electronics, Inc., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/610,763

[22] Filed: Mar. 5, 1996

[51] Int. Cl.$^6$ ........................................... H04B 1/26
[52] U.S. Cl. ........................... 455/161.2; 455/168.1; 455/180.3; 455/183.2; 455/260; 455/323
[58] Field of Search ........................ 455/161.2, 160.1, 455/168.1, 161.1, 180.3, 188.2, 189.1, 183.1, 183.2, 184.1, 76, 85–87, 255, 257, 258, 259, 260, 314, 318, 321, 323

[56] References Cited

U.S. PATENT DOCUMENTS

| | | |
|---|---|---|
| 4,246,539 | 1/1981 | Haruki et al. ............................... 455/76 |
| 4,627,100 | 12/1986 | Takano .................................. 455/160.1 |
| 4,661,995 | 4/1987 | Kashiwagi ............................ 455/183.2 |
| 4,703,520 | 10/1987 | Rozanski, Jr. et al. ............... 455/183.1 |
| 5,179,729 | 1/1993 | Mishima et al. ......................... 455/260 |
| 5,212,817 | 5/1993 | Atkinson .............................. 455/161.2 |
| 5,465,402 | 11/1995 | Ono et al. ............................. 455/161.2 |
| 5,606,736 | 2/1997 | Hasler et al. ............................ 455/260 |
| 5,610,559 | 3/1997 | Dent ......................................... 455/260 |

*Primary Examiner*—Nguyen Vo
*Assistant Examiner*—Lester G. Kincaid
*Attorney, Agent, or Firm*—Trexler, Bushnell, Giangiorgi & Blackstone, Ltd.

[57] ABSTRACT

A scanning radio receiver of triple conversion superheterodyne tuning, having a CPU and a keyboard. The CPU has a programmable memory to store frequencies received by the scanning radio receiver. A first and second frequency mixer for frequency converting a radio wave signal, with a respective local frequency, providing for a first and second IF signal, respectively. A PLL frequency synthesizer for generating the respective local frequencies, depending upon the frequency of the desired radio wave signal to be received, the frequency of which is keyed into the keyboard. A third frequency mixer for frequency converting the second IF signal with a third local frequency. An FM demodulator for reproducing an FM audio signal. An AM detector for reproducing an AM audio signal. An AM/FM switch for receiving the FM and AM audio signals and providing a selective audio signal in response to instruction from the CPU.

1 Claim, 33 Drawing Sheets

| FIG. 8' | FIG. 8" | FIG. 8''' | FIG. 8'''' |

FIG. 8

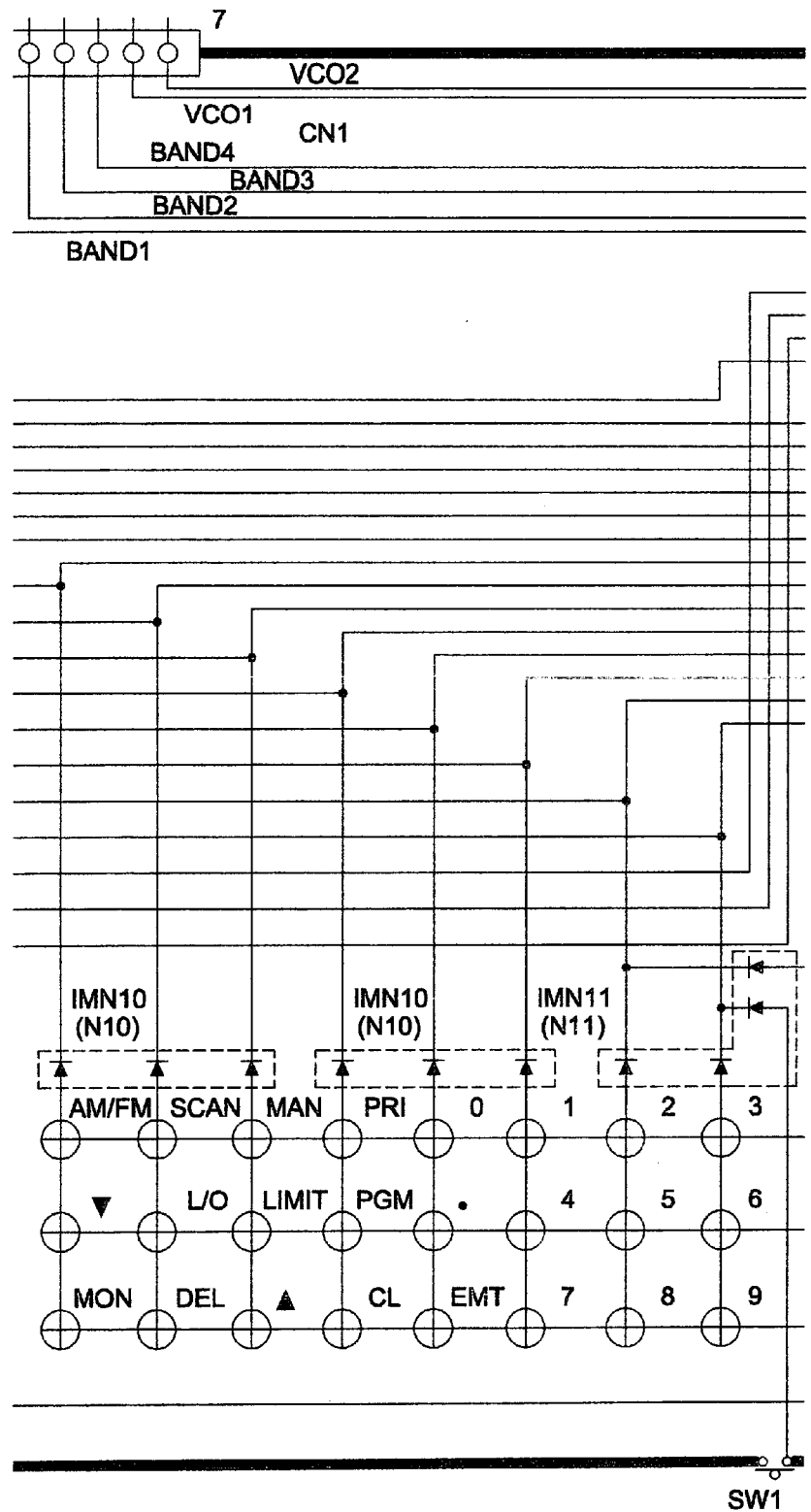
FIG. 8"

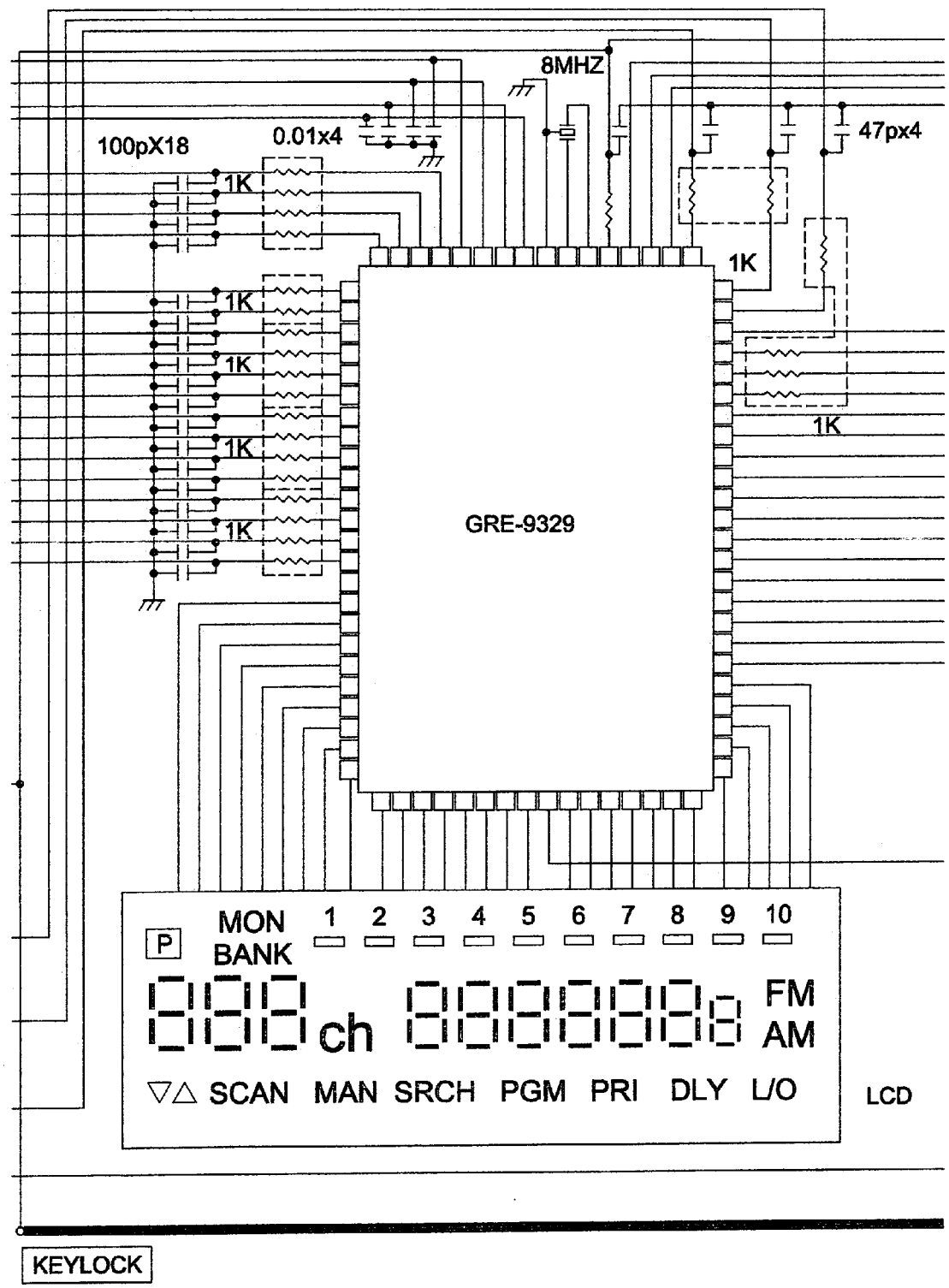
FIG. 8''''

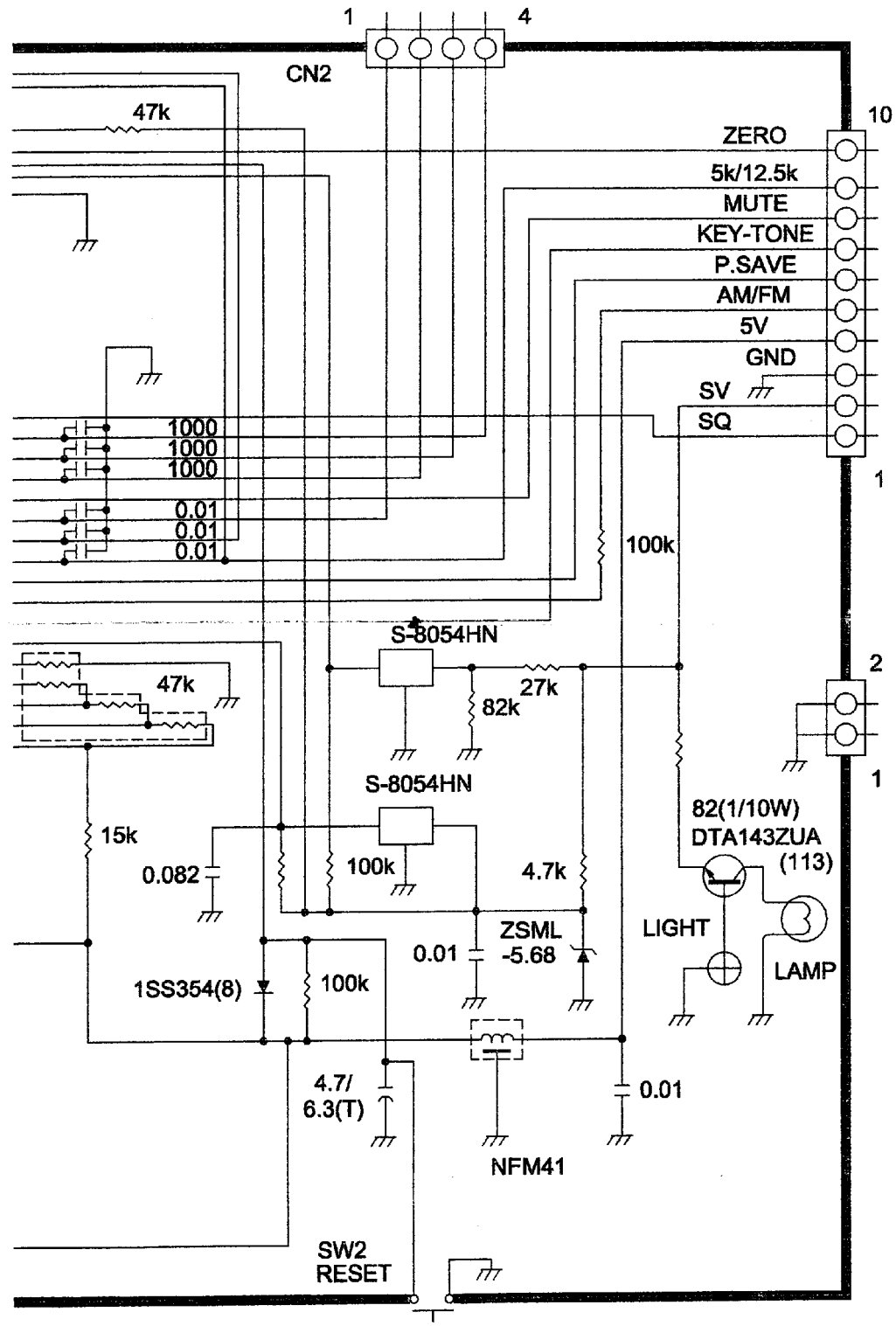
FIG. 8''''

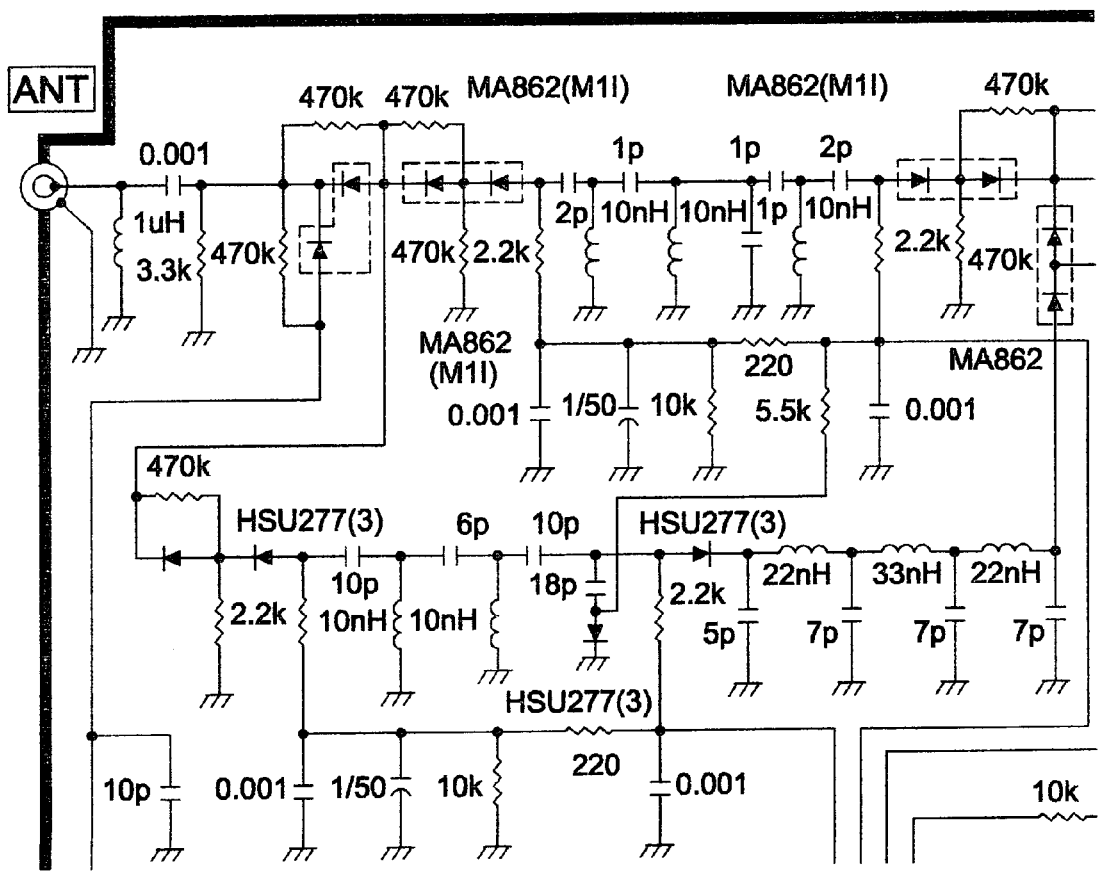

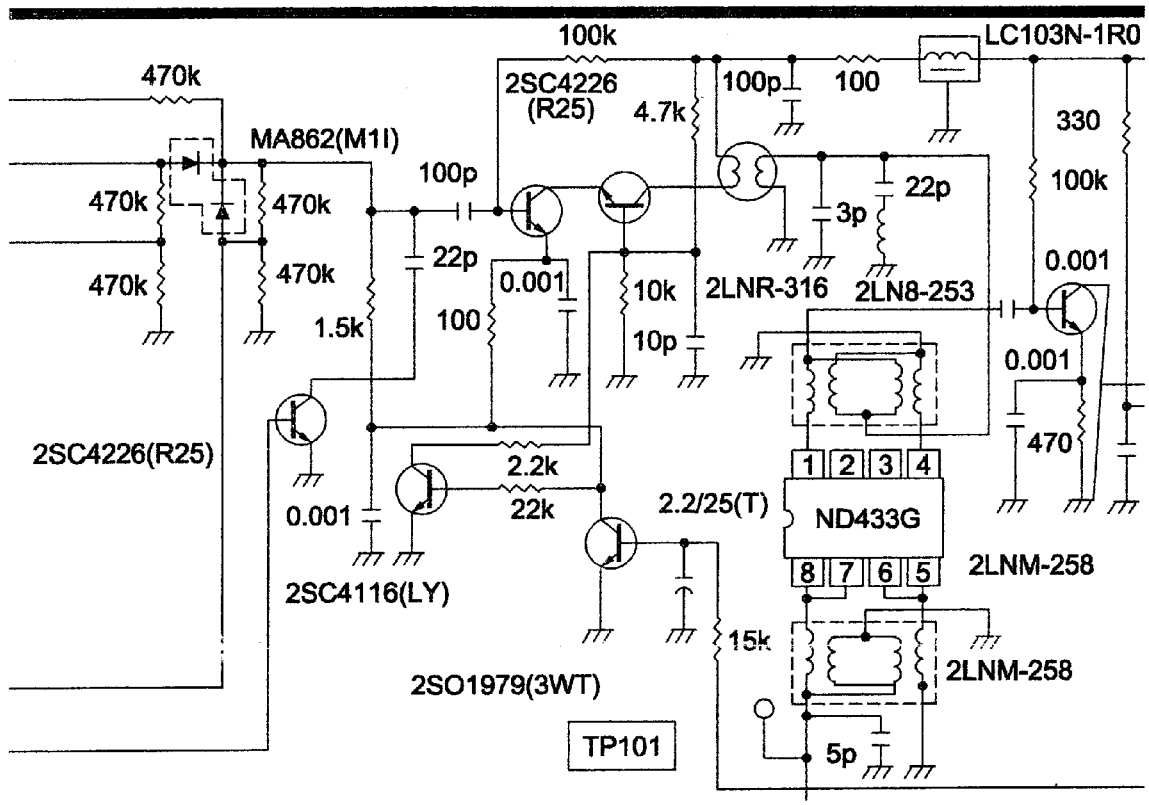
FIG. 9"

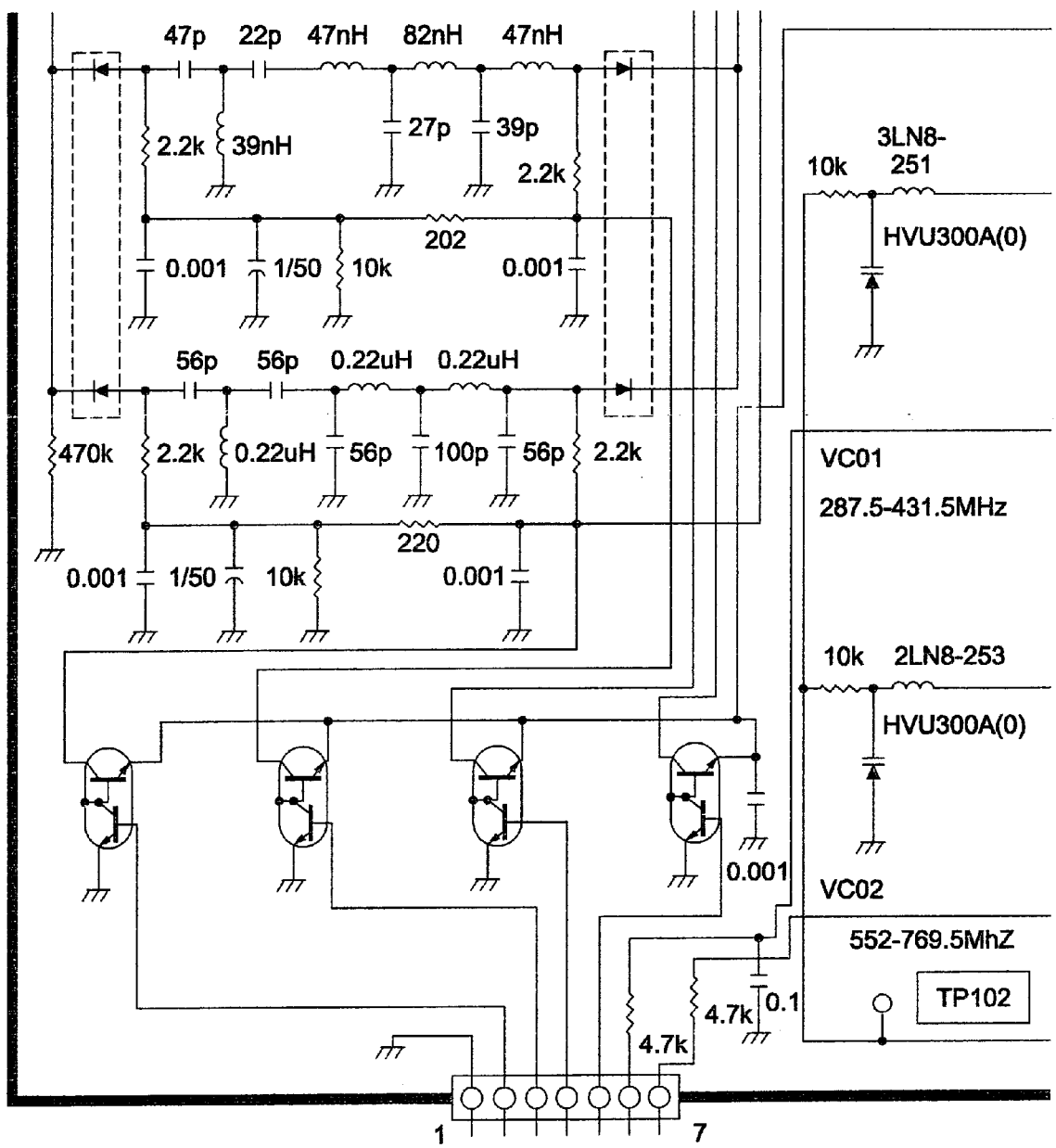
FIG. 9""

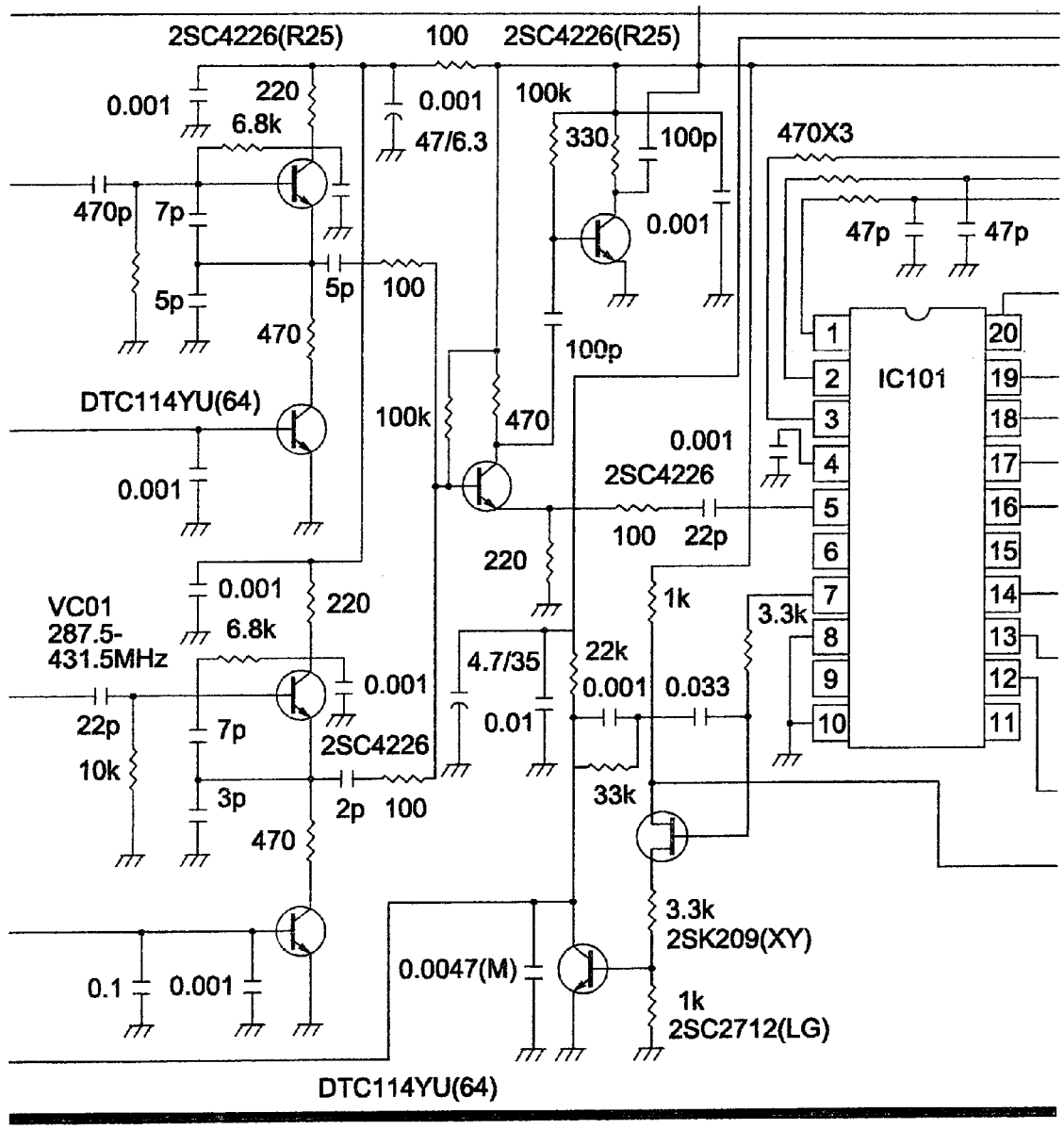
FIG. 9"""""

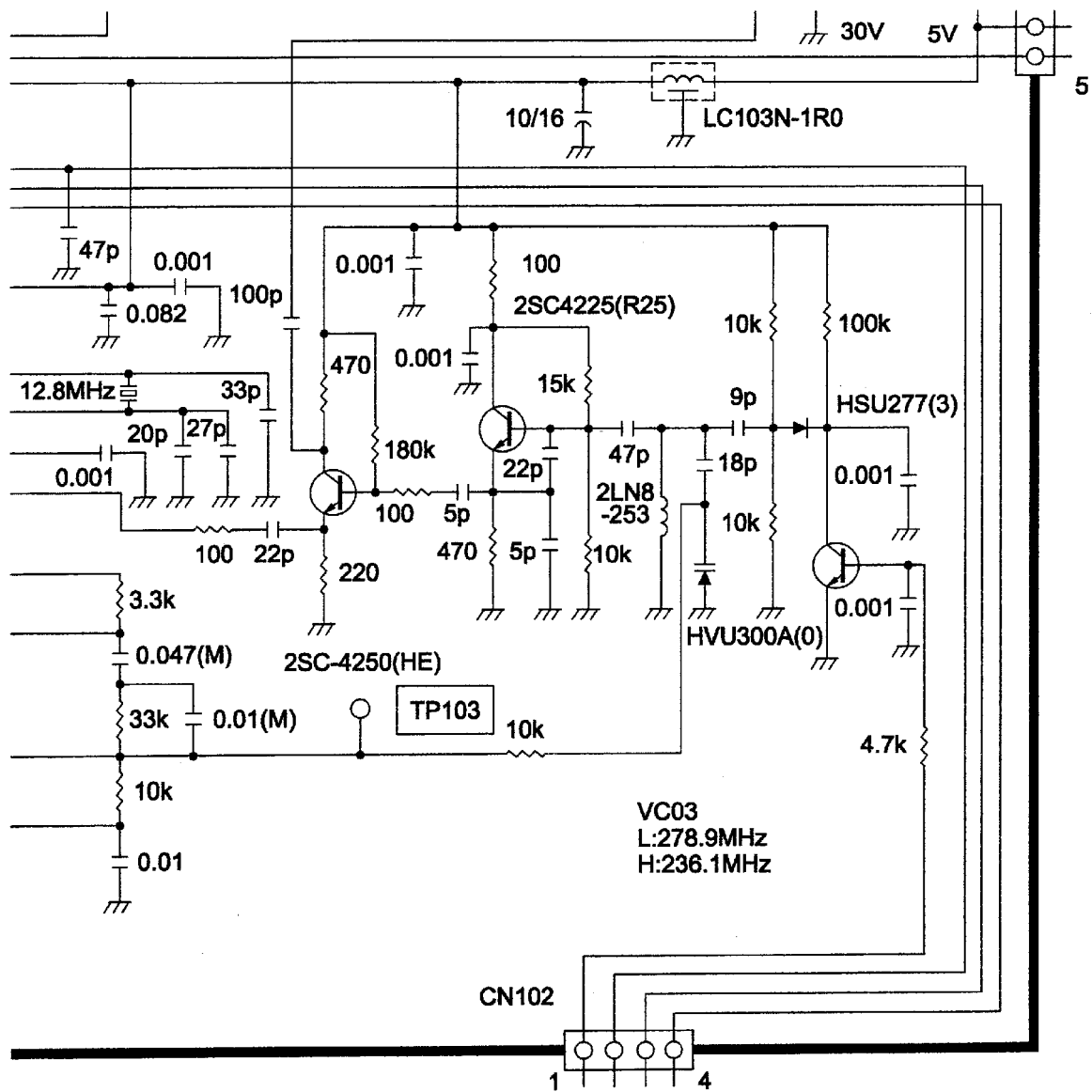
FIG. 9'''''''

| FIG. 10' | FIG. 10" | FIG. 10''' |

FIG. 10

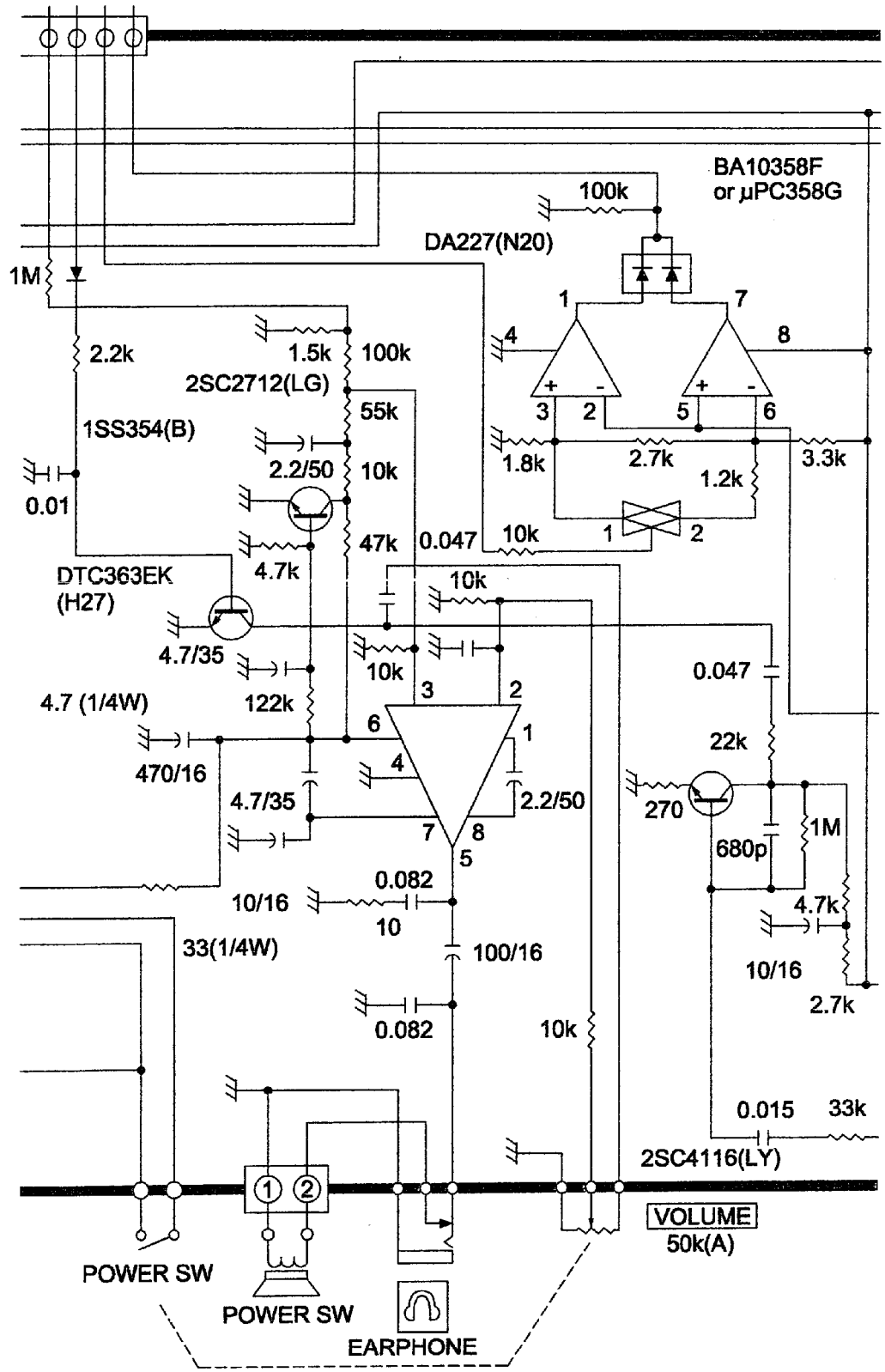
FIG. 10"

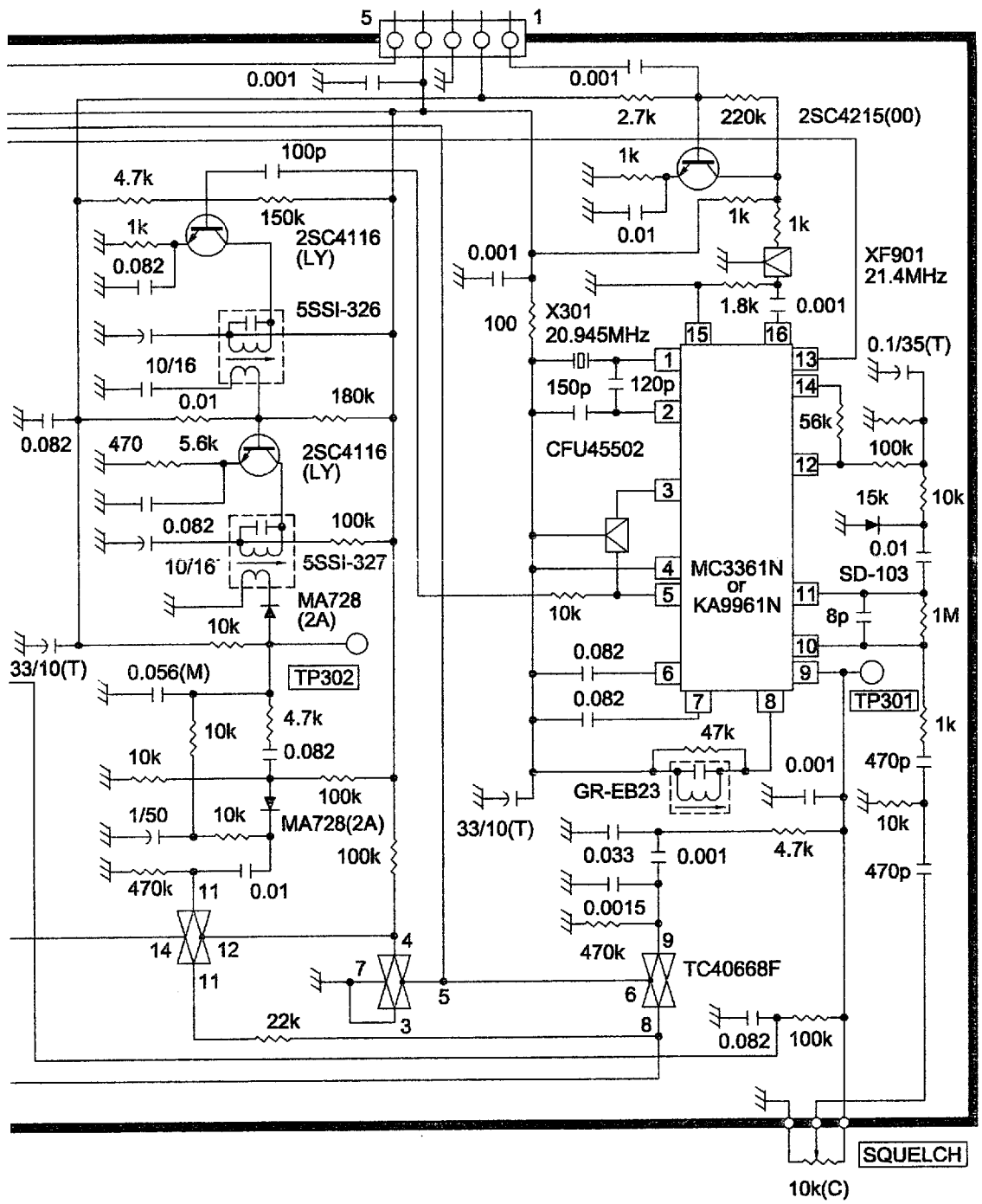
FIG. 10''''

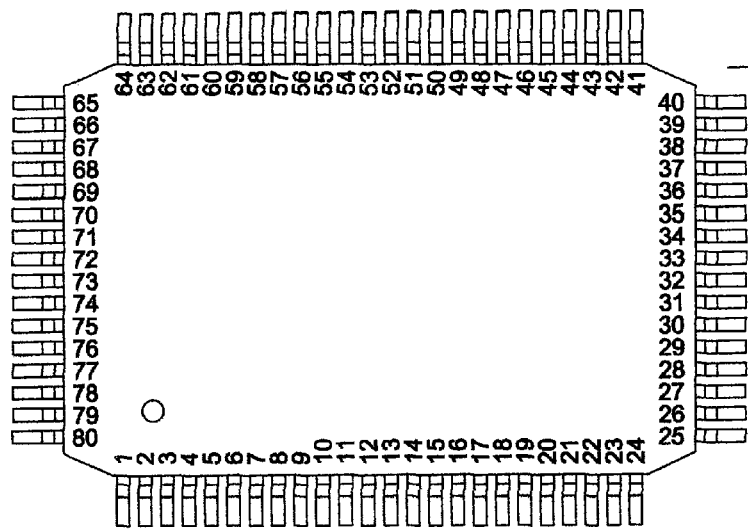

FIG. 12

| Pin No. | Function | Pin No. | Function |
|---|---|---|---|
| 1 | LCD segment 0 output | 41 | Memory $\overline{WE}$ output |
| 2 | LCD common 3 output | 42 | Memory $\overline{OE}$ output |
| 3 | LCD common 2 output | 43 | Memory $\overline{CE}$ output |
| 4 | LCD common 1 ouput | 44 | Memory A10 output |
| 5 | LCD common 0 output | 45 | Memory A9 output |
| 6 | LCD bias output | 46 | Memory A8 output |
| 7 | LCD bias output | 47 | Memory A7 output |
| 8 | LCD bias output | 48 | Memory A6 output |
| 9 | LCD bias control output | 49 | Memory A5 output |
| 10 | Switch output | 50 | Memory A4 output |
| 11 | Standby Input | 51 | Memory A3 output |
| 12 | Beep tone output | 52 | Memory A2 output |
| 13 | AM/FM mode output | 53 | Memory A1 output |
| 14 | Power save output | 54 | Memory A0 output |
| 15 | VCO1 output | 55 | N.C. |
| 16 | VCO2 output | 56 | LCD segment 24 output |
| 17 | VCO3 output | 57 | LCD segment 23 output |
| 18 | Mute output | 58 | LCD segment 22 output |
| 19 | PLL reset pulse input | 59 | LCD segment 21 output |
| 20 | PLL clock input | 60 | LCD segment 20 output |
| 21 | PLL data input | 61 | LCD segment 19 output |
| 22 | Squelch input | 62 | LCD segment 18 output |
| 23 | Key input | 63 | LCD segment 17 output |
| 24 | Key input | 64 | LCD segment 16 output |
| 25 | Key input | 65 | LCD segment 15 output |
| 26 | Low battery input | 66 | LCD segment 14 output |
| 27 | Reset input | 67 | LCD segment 13 output |
| 28 | Zeromatic input | 68 | LCD segment 12 output |
| 29 | Diode matrix input | 69 | LCD segment 11 output |
| 30 | Osc. input | 70 | LCD segment 10 output |
| 31 | Osc. output | 71 | LCD segment 9 output |
| 32 | GND | 72 | LCD segment 8 output |
| 33 | VHF low/mid output | 73 | VDD |
| 34 | VHF high output | 74 | LCD segment 7 output |
| 35 | UHF low output | 75 | LCD segment 6 output |
| 36 | UHF high output | 76 | LCD segment 5 output |
| 37 | Memory I/O1 | 77 | LCD segment 4 output |
| 38 | Memory I/O2 | 78 | LCD segment 3 output |
| 39 | Memory I/O3 | 79 | LCD segment 2 output |
| 40 | Memory I/O4 | 80 | LCD segment 1 output |

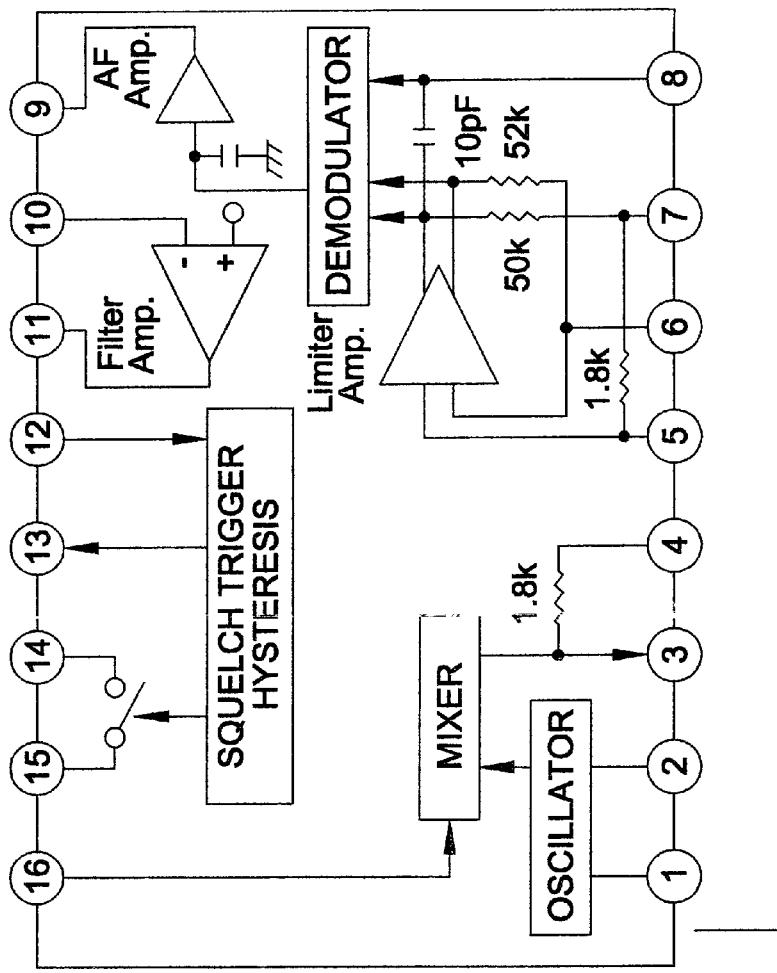
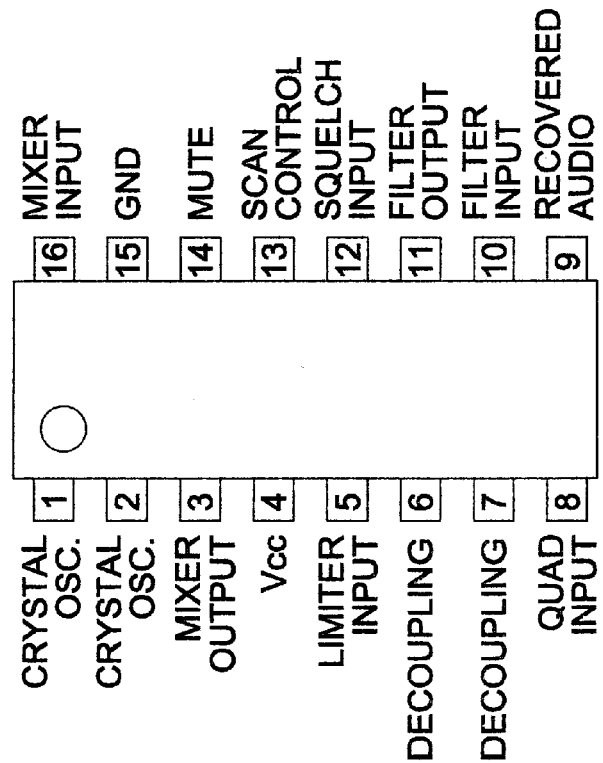
FIG. 15

SCANNING RADIO RECEIVER

BACKGROUND OF THE INVENTION

This invention relates to a novel PLL (Phase-Locked Loop) synthesized scanning radio receiver controlled by a CPU (Central Processing Unit) via a keyboard. More particularly, the present invention relates to a scanning radio receiver which is intended to simplify the structure thereof, without sacrificing the high performance of the scanning radio receiver.

In order to control various functions of the radio receiver, a CPU is usually included with the receiver. Additionally, a keyboard is usually included with the receiver to enable an operator to give various commands or instructions to the CPU in order to operate the radio receiver. It is then possible for the operator to set a reception objective frequency, via the keyboard, into the radio receiver in order to attain the desired or targeted reception objective frequency.

FIG. 1 illustrates an example of a conventional radio receiver having a CPU 10 and a keyboard 12, in which a radio wave of a designated frequency can be tuned, by keying in that designated frequency into the keyboard, in order to reproduce its modulating audio signal. This radio receiver is constructed as a double superheterodyne system having means for converting the received radio wave signal into a first IF (Intermediate Frequency) signal and then further converting the first IF signal to a second IF signal, the second IF signal having a lower frequency than that of the first IF signal.

More specifically, a radio wave signal is received by an antenna 14, the frequency of which is keyed in from the keyboard 12, and is adapted to pass through either a VHF RF amplifier 16 or a UHF RF amplifier 18, depending upon the radio wave signal's frequency. If the frequency of the radio wave signal or reception objective signal, which is keyed in from the keyboard, is within the VHF frequency range, the VHF RF amplifier 16 is activated and the UHF RF amplifier 18 is deactivated, whereby the reception objective signal can pass through the activated VHF RF amplifier 16. Conversely, if the frequency of the reception objective signal, which is keyed in from the keyboard, is within the UHF frequency range, the VHF RF amplifier 16 is deactivated and the UHF RF amplifier 18 is activated, whereby the reception objective signal can pass through the activated UHF RF amplifier 18. The decision as to which RF amplifier 16 or 18 is activated or deactivated, may be made by the provision of an activating or deactivation signal on lines 17 and 19, respectively, from the CPU 10 depending upon the frequency of the reception objective wave signal which is keyed in from the keyboard.

The VHF reception objective signal which has passed through the activated VHF RF amplifier 16 is then applied to a first VHF mixer 20 so that the VHF reception objective signal is frequency-converted to be provided as a first IF signal of 10.7 MHz. Similarly, the reception objective signal which has passed through the activated UHF RF amplifier 18 is applied to a first UHF mixer 22 so that the UHF reception objective signal is frequency-converted to be provided as the first IF signal of 10.7 MHz. This first IF signal is then amplified by a first IF amplifier 24 which is tuned to the 10.7 MHz frequency range, and applied to a second mixer 26 in which the first IF signal is frequency-converted to a second IF signal of 455 KHz by the use of a 10.245 MHz beat frequency signal generated from a local oscillator 28. The second IF signal of 455 KHz is then passed through a band-pass filter (not shown) for increasing selectivity, amplified by a second IF amplifier (not shown), and detected in order to reproduce an audio signal.

In such a superheterodyne system, a great number of frequencies are required to be applied to the first mixer 20 or 22 in order to convert the frequency of the VHF or UHF reception objective wave signal into the 10.7 MHz first IF signal frequency. For example, if the receiver can receive the VHF low band ranging over 30 to 54 MHz in 5 KHz increments, 4,800 beat frequencies are needed, and if the receiver can receive the VHF high band ranging over 136.005 to 174 MHz in 5 KHz increments, 7,599 beat frequencies are needed. For the reception of the UHF band of 380 to 512 MHz in 12.5 KHz increments, 10,560 beat frequencies must be applied to the first mixer 22 for the UHF band.

In the conventional radio receiver, as illustrated in FIG. 1, these beat frequencies are generated by a PLL frequency synthesizer circuit which includes a first VCO (Voltage Controlled Oscillator) 30 for generating lower frequencies and a second VCO 32 for generating higher frequencies. The outputs of these VCO's 30 and 32 are applied through a buffer amplifier 34 to the VHF mixer 20, and only the output of the VCO 32 is applied the UHF mixer 22 through a frequency tripler 36 of which activation is controlled by the CPU 10. Control signals for selectively operating the VCO's 30 and 32 are applied from the CPU 10 through lines 31 and 33, respectively. The PLL frequency synthesizer circuit further includes a reference divider circuit 38 to which a stable frequency source 40 such as a temperature compensated crystal, is connected, a comparison divider circuit 42, a phase comparator 44 which receives the outputs of the reference and comparison divider circuits 38 and 42, a low-pass filter 46 of which output is connected to the control input of the VCO's 30 and 32, and a prescaler 48 connected between the output of the buffer amplifier 34 and an input of the comparison divider circuit 42. The reference and comparison divider circuits, 38 and 42, receive a series of clock, data, and latch signals through lines 50, 52, and 54, respectively, from the CPU 10.

The reference divider circuit 38 comprises, for example, a 14-bit shift register, a 14-bit latch and a 14-bit binary counter. The comparison divider circuit 42 comprises, for example, a 17-bit shift register consisting of a 7-bit shift register and a 10-bit shift register, a 17-bit latch consisting of a 7-bit latch and a 10-bit latch, and a 7-bit swallow and 10-bit programmable counter combination. In operation, each rising edge of the clock signal from the CPU 10 shifts one bit of the data signal from the CPU 10 into the 14-bit and 17-bit shift registers. The last data bit (control bit) entered determines which latch of the 14-bit and 17-bit latches is activated; one logic (for example, "H") selects the 14-bit reference latch and the other logic (for example, "L") selects the 17-bit comparison latch. One logic (for example, "H") of the latch signal from the CPU 10 latches the data from the shift register into the reference or comparison latch depending on the control bit of the data. For example, if the control bit is at a logic high, the reference latch is activated, and if the control bit is at a logic low, the comparison latch is activated. The contents transferred to the respective latches provide dividing ratios of the respective divider circuit. The output of the prescaler 48 acts as a clock input for the 7-bit swallow and 10-bit programmable counter combination, and for example, a rising edge signal decrements the swallow and programmable counters. A stable frequency from the stable frequency source 40 is applied to the 14-bit reference counter as its clock. The output frequency (fr) of the reference counter, constituting the output of the reference divider circuit 38, and the output frequency (fc) of the comparison counters, constituting the output of the comparison divider circuit 42, are phase-compared in the phase comparator 44. For example, if frequency (fc), is greater than (fr), or if the phase of (fc) is leading, then the phase comparator 44 provides negative pulses as error information; if the frequency (fc), is less than (fr), or if the phase of (fc) lagging, then the phase comparator 44 provides positive pulses as error information; and if the frequency of (fc)=(fr), and both are in phase, then the phase comparator 44 provides a high impedance output.

If a dual-modulus prescaler is used for the prescaler 48, a control logic circuit is used in connection with the comparison counters to control the dual-modulus prescaler, and generates a signal therefor. For example, the level of this signal is low at the beginning of a count cycle and remains low until the 7-bit swallow (÷A) counter has counted down from its programmed value. At this time, the dual-modulus prescaler control signal goes high and remains high until the 10-bit programmable (÷N) counter has counted the rest of the way down from its programmed value (N−A=Total dual-modulus prescaler control signal high time, since the (÷N) counter simultaneously counts down during the (÷A) counter count down period during the first portion of the cycle). The dual-modulus prescaler signal is then set back low, the counters reset to their respective programmed values, and the above sequence repeated. This provides for a total programmable divide value of (NT)=N*P+A where P and P+I represent the dual-modulus prescaler divide values respectively for high and low modulus control levels, N being the number programmed into the (÷N) counter, and A being the number programmed into the (÷A) counter. For example, MC145158-2 manufactured and sold by Motorola as a serial-input PLL frequency synthesizer IC includes such reference divider circuit 38, comparison divider circuit 42 and phase comparator 44.

With this conventional circuit structure, it is possible for the radio receiver to receive a limited range of radio wave signals in the VHF low band (30–54 MHz) or the VHF high band (138–174 MHz) and the UHF band (380–512 MHz). However, there is a demand for a wider frequency range radio receiver which can cover wide frequency ranges such as 30–54 MHz (or 68–88 MHz), 118–174 MHz, 380–512 MHz, and 806–960 MHz, for example, with a relatively simpler construction. The present invention presents such a radio receiver. Other features and advantages of the present invention will become apparent upon a reading of the attached specification.

OBJECTS AND SUMMARY OF THE INVENTION

A general object of the present invention is to provide a novel and improved radio receiver.

A more particular object is to provide a super wide frequency range radio receiver which can receive and cover super wide frequency ranges, such as 30–54 MHz, 118–174 MHz, 380–512 MHz, and 806–960 MHz, for example, with a relatively simpler construction and in such a manner that intermediate frequency imaging interference can be virtually eliminated.

Briefly, and in accordance with the foregoing, the present invention discloses a novel scanning radio receiver having a CPU for controlling the operation of the receiver, the CPU having a programmable readable memory means into which frequencies to be received by the scanning radio receiver may be stored. A keyboard, providing for utilization of scan functions and inputting any frequency to be stored to the memory means, is connected to the CPU. A first mixing means is provided for frequency-converting a reception objective radio wave signal with a first local frequency so that a first IF signal is provided. A second mixing means is provided for frequency-converting the first IF signal with a second local frequency so that a second IF signal is provided.

A PLL frequency synthesizer means is provided for generating the first and second local frequencies, depending upon the frequency of the reception objective radio wave signal, and supplying the first local frequency to the first mixing means, in addition to, supplying the second local frequency to the second mixing means. The PLL frequency synthesizer means has first and second VCO (Voltage Controlled Oscillator) means for providing the first and second local frequencies, respectively, on the basis of control signal from a respective phase comparator, each phase comparator comparing a common reference divider output, responsive to a stable frequency, and a respective comparison divider output, responsive to the respective VCO means output. The PLL frequency synthesizer means receives a data signal and a clock signal from the CPU which corresponds to the frequency of the reception objective radio wave signal. The data signal, received by the PLL, includes data relating to a divide value for a divider, data relating to the selection of a divider associating latch to be updated, and data relating to activation of the phase comparators.

A third mixing means is provided. The third mixing means is used to frequency-convert the second IF signal with a third local frequency, which is a predetermined fixed frequency, so that a third IF signal is provided. An FM demodulation means is provided for reproducing an FM audio signal from the third IF signal when the modulation type of the reception objective radio wave signal is FM. An AM detection means is provided for reproducing an AM audio signal from the third IF signal when the modulation type of the reception objective radio wave signal is AM. An AM/FM switching means is provided for receiving either of the respective AM and FM audio signals, and for providing the selective audio signal in response to instruction from the CPU.

Additionally, the PLL frequency synthesizer means has a shift register for receiving the data signal and clock signal from the CPU. The shift register has shift stages of the number corresponding to the serial data length of the data signal, a pulse counter which is reset by a reset signal from the CPU after the pulse counter has counted the number of clock pulses of the clock signal corresponding to the number of shift stages of the shift register, and a latch selection circuit for receiving the data relating to the selection of a divider associating latch to be updated, from the shift register and the output from the pulse counter, providing data as to when and which divider associating latch is selectively updated.

The scanner radio receiver memory means has a predetermined number of permanent memory locations which are divided into banks, scanning being conducted over the memory locations in the bank. Additionally, the memory means has a predetermined number of temporary memory locations on which frequencies are temporarily stored before they are stored in the permanent memory locations for scanning.

Additionally, the scanning radio receiver has a band-pass filter inserted at a stage before the reception objective radio wave signal is mixed for frequency conversion in the first mixer. The band-pass filter has a plurality of band-pass filter portions each having an assigned pass-band, only one of which is activated by instruction from the CPU depending upon the frequency of the reception objective radio wave signal, so that the reception objective radio wave signal is passed through the activated band pass filter portion of which ever passband covers the frequency of the particular reception objective radio wave signal.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 12 illustrates the pin arrangement and pin functions of IC2 as used in FIG. 8;

FIG. 15 illustrates the pin arrangement and functional block diagram of IC301 as used in FIG. 10;

DETAILED DESCRIPTION OF THE PREFERRED EMBODIMENT

Figure 1:
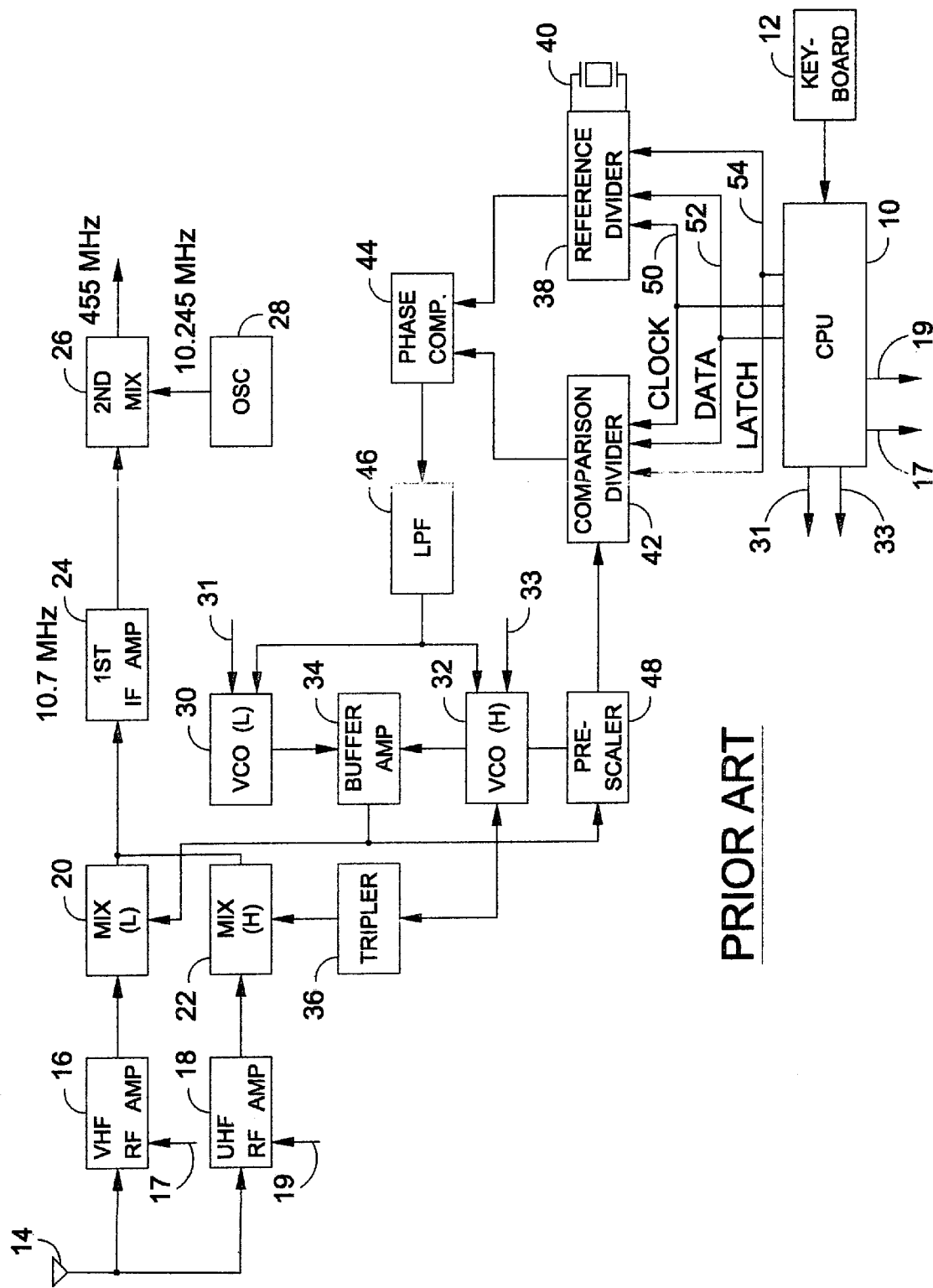
FIG. 1 illustrates a block diagram of a conventional radio receiver having a CPU connected to a keyboard and a PLL frequency synthesizer circuit.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

The present invention is directed to novel PLL (Phased Locked Loop) synthesized scanning radio receiver 11 controlled by a CPU 56 (Central Processing Unit) via a keyboard 57, in which the scanning radio receiver 11 is capable of receiving radio waves over wide frequency ranges, such as 30–54 MHz (or 68–88 MHz), 118–174 MHz, 380–512 MHz, and 806–960 MHz, with a relatively simple construction and in such a manner that intermediate frequency imaging interference can be virtually eliminated.

The scanning radio receiver 11 has the CPU 56 for controlling the operation of the receiver 11, connected to the keyboard 57 by which the frequency of a reception objective radio wave signal is keyed in. The reception objective radio wave signal is then passed through a band pass filter 55 and an RF amplifier 58 before the wave signal is mixed in first mixing means 60, providing a first IF signal at the output of the first mixing means 60. The first IF signal is then passed through an IF amplifier 62 before the signal is mixed again in second mixing means 64, providing a second IF signal at the output of the second mixing means 64. The second IF signal may further be passed through an additional IF amplifier 66, before the signal is mixed again in third mixing means 68. The third mixing means 68 provides a third IF signal at the output of the third mixing means 68. This third IF signal may be filtered, amplified, and either detected or quadrature-discriminated depending on the modulation of the third IF signal, in order to produce an audio signal.

Figure 2:
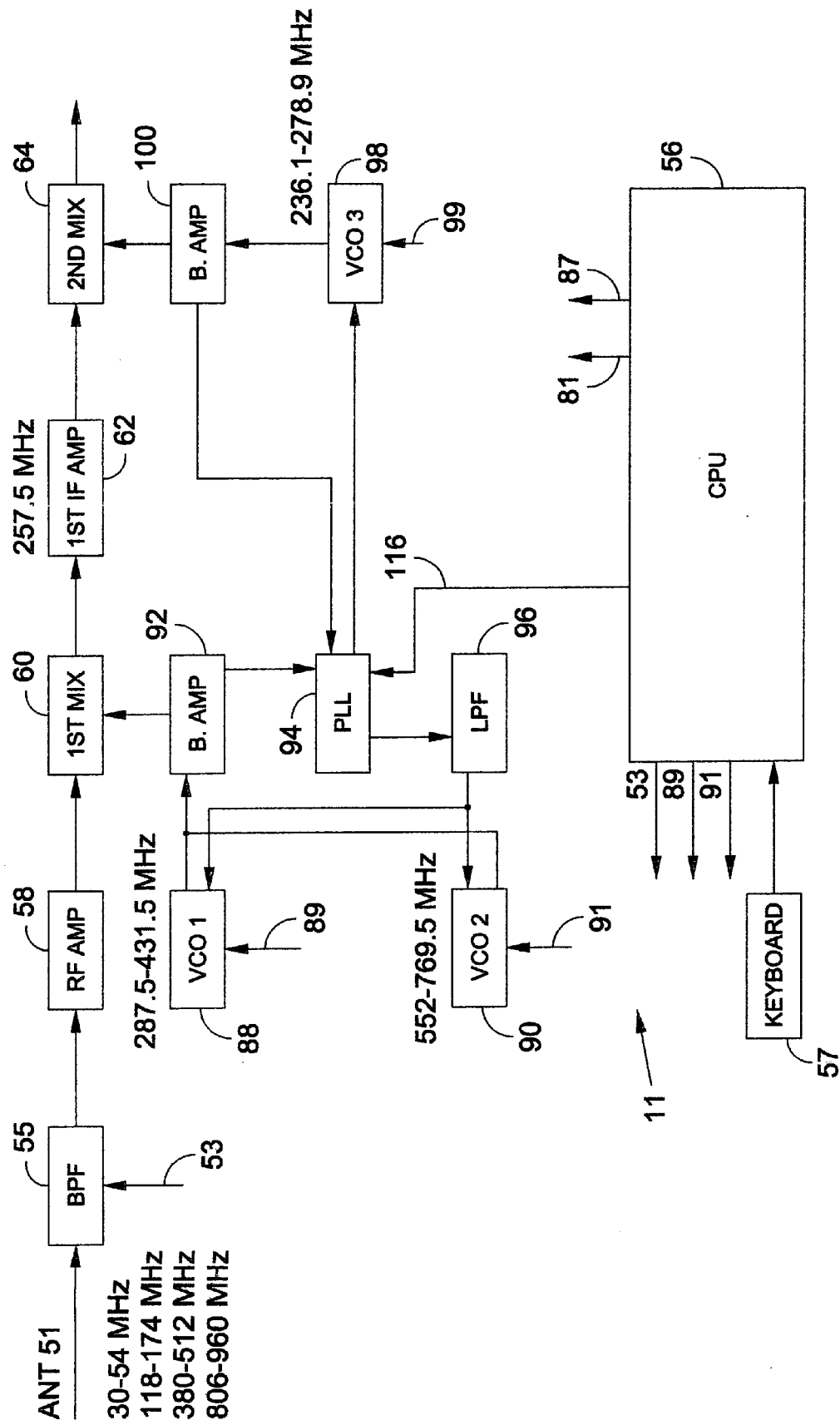
FIGS. 2 and 3 illustrate, in combination with each other, a block diagram of a scanning radio receiver according to an embodiment of the present invention.
Figure 3:
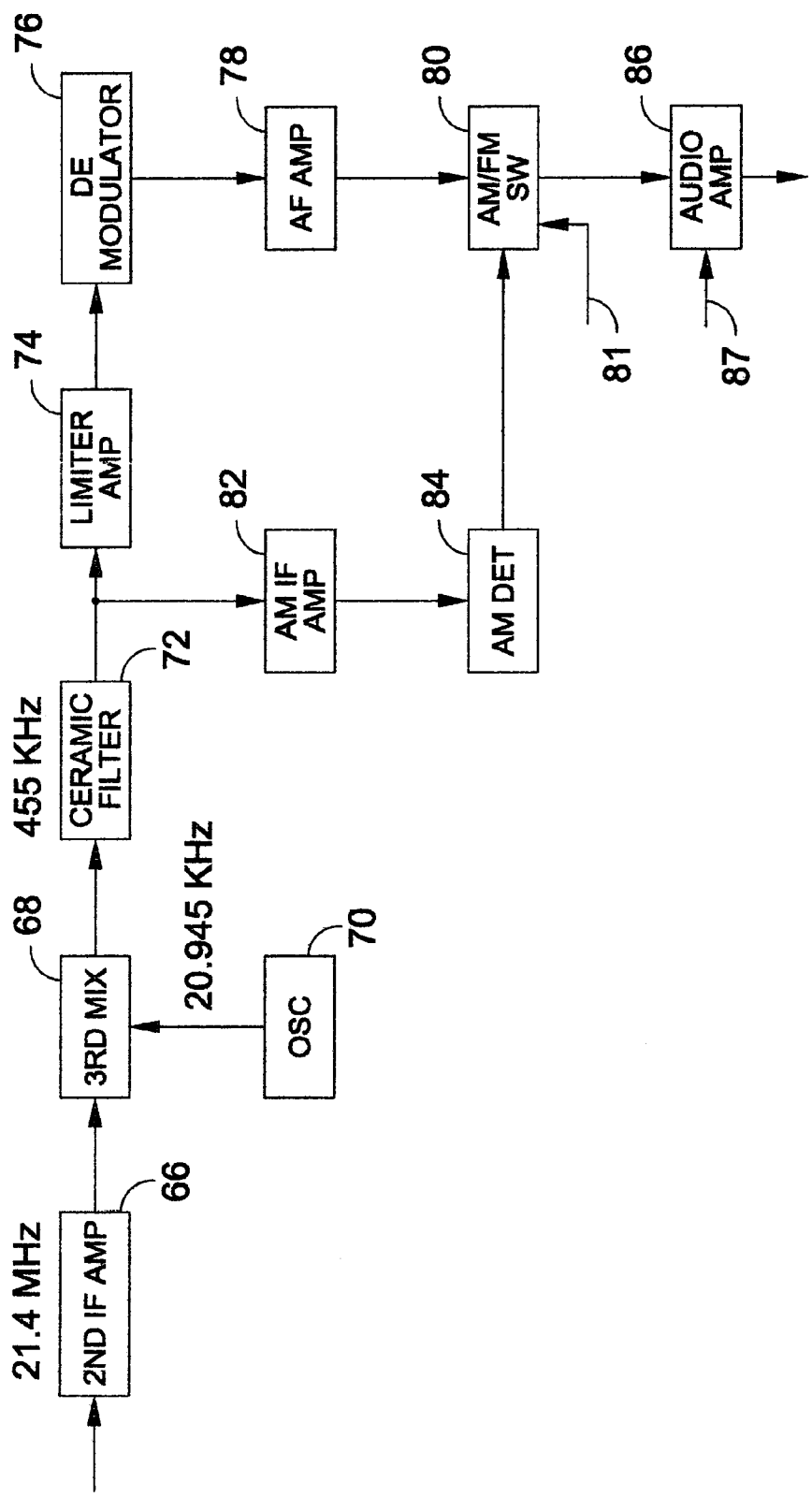

FIGS. 2 and 3, in combination, show block diagrams of the scanning radio receiver 11 which is an embodiment of this invention. The scanner radio receiver 11 has capability to receive a radio wave signals in the frequency ranges of 30–54 MHz (or 68–88 MHz), 137–174 MHz, 380–512 MHz, and 806–960 MHz. The increment of the frequencies to be received by the scanner radio receiver 11 may be selected to 5 KHz, 12.5 KHz, or 25 KHz. For example, frequency coverage at the 30–54 MHz and 137–174 MHz ranges are in 5 KHz steps, frequency coverage at the 380–512 MHz and 806–960 MHz ranges are in 12.5 KHz steps, and frequency coverage at the 118–136.975 MHz range is in 25 KHz steps.

The band-pass filter 55, which is connected to an antenna 51, comprises a band-pass filter portion of the receiver 11. The band-pass filter 55 is comprised of a series of individual band-pass filter portions, for example, a band-pass filter portion having a pass-band of 30–54 MHz, a band-pass filter portion having a pass-band of 118–174 MHz, a band-pass filter portion having a pass-band of 380–512 MHz, and a band-pass filter portion having a pass-band of 806–960 MHz. Determination as to which particular filter portion is activated, provided by a filter portion selecting signal on a line 53 from the CPU 56, is dependent upon the reception objective signal frequency provided to the CPU 56 through the keyboard 57.

The reception objective signal which has been passed through the selected band-pass filter portion of the band-pass filter 55 is then amplified in the RF amplifier 58, and further applied to the first mixing means 60. The RF signal applied to the first mixing means 60 is frequency-converted into the first IF signal of 257.5 MHz within the first mixing means 60. This first IF signal is then applied to the first IF amplifier 62 having a tuned frequency range of approximately 257.5

MHz, and further applied to the second mixing means 64 in which it is frequency-converted into the second IF signal of 21.4 MHz. The second IF signal from the second mixing means 64 is then applied to the third mixing means 68 through a second IF amplifier 66, which may include a crystal filter tuned to the second IF frequency of 21.4 MHz. In the third mixing means 68 the second IF signal is frequency-converted with a local oscillator signal of 20.954 KHz, from a crystal oscillator circuit 70, converting the second IF signal into the 455 KHz third IF signal which is applied to a ceramic filter 72 having a narrow pass-band of 455 KHz to improve selectivity.

If the third IF signal from the ceramic filter 72 is an FM signal (FM third IF signal), then the FM signal is applied to a demodulator 76, through a limiter amplifier 74, wherein the FM signal is quadrature-discriminated in the demodulator 76, so that the audio signal is provided. The audio signal is then applied to an audio frequency amplifier (IF AMP) 78. This audio signal (FM audio signal) is then further applied to an AM/FM switching circuit 80, controlled by a signal on line 81, and finally to an audio amplifier 86.

Alternately, if the third IF signal from the ceramic filter 72 is an AM signal (AM third IF signal), then the AM signal is applied to an AM detector 84, through an AM third IF amplifier 82, producing the audio signal. The audio signal (AM audio signal) from the AM detector 84 is then applied to the AM/FM switching circuit 80, controlled by a signal on line 81, and finally to the audio amplifier 86.

The audio amplifier 86 receives a key tone signal, on signal line 87, from the CPU 56. This key tone represents a status in which a particular key on the keyboard 57 is activated or pressed.

In the scanning radio receiver 11 shown in FIGS. 2 and 3, receiving mode and search step are initially set to correspond with the frequencies entered via the keyboard 57. When a frequency in active radio band, police, fire, ham radio, etc., is keyed in via the keyboard 57, the receiving mode of the scanning radio receiver 11 is set to the FM mode, and when a frequency in the aircraft band is keyed in, the scanning radio receiver 11 sets to the AM mode. The mode can also be changed by an AM/FM key provided on the scanning radio receiver 11 itself.

All functions, such as the receiving frequency range, frequency determination, scanning and delay time are controlled by the CPU 56. Appendix I shows the general operation outline of the scanning radio receiver 11 according to the embodiment of this invention.

The scanning radio receiver 11 uses the first mixing means 60 as the first frequency converter means to facilitate 30 to 960 MHz mixing. In order to supply the first mixing means 60 with a first local frequency signal of 287.5–431.5 MHz and 552–769.5 MHz for the frequency conversion, two voltage controlled oscillators (VCO's), 88 and 90, are used, the output of which are applied to the first mixing means 60 through a buffer amplifier 92. The VCO (1) 88 generates a frequency of 287.5–431.5 MHz and the VCO (2) 90 generates a frequency of 552–769.5 MHz. Which VCO is activated is determined by an instruction from the CPU 56, depending upon the frequency of the reception objective wave signal selected by the receiver 11. The VCO's, 88 and 90, have respective input lines, 89 and 91, for receiving such instructions from the CPU 56. Additionally, a VCO output frequency controlling signal is applied from a PLL circuit 94 to the VCO's, 88 and 90, through a low-pass filter (LPF) 96.

Similarly, the second local frequency signal of 236.1–278.9 MHz applied to the second mixing means 64, which is used as the second frequency converter means, is generated by a VCO (3) 98. The output frequency of the VCO (3) is applied to the second mixing means 64 through a buffer amplifier 100 to provide the second IF signal of 21.4 MHz at the output of the second mixing means 64. Additionally, a VCO output frequency controlling signal is applied from a PLL circuit 94 to the VCO (3) 98.

Figure 4:
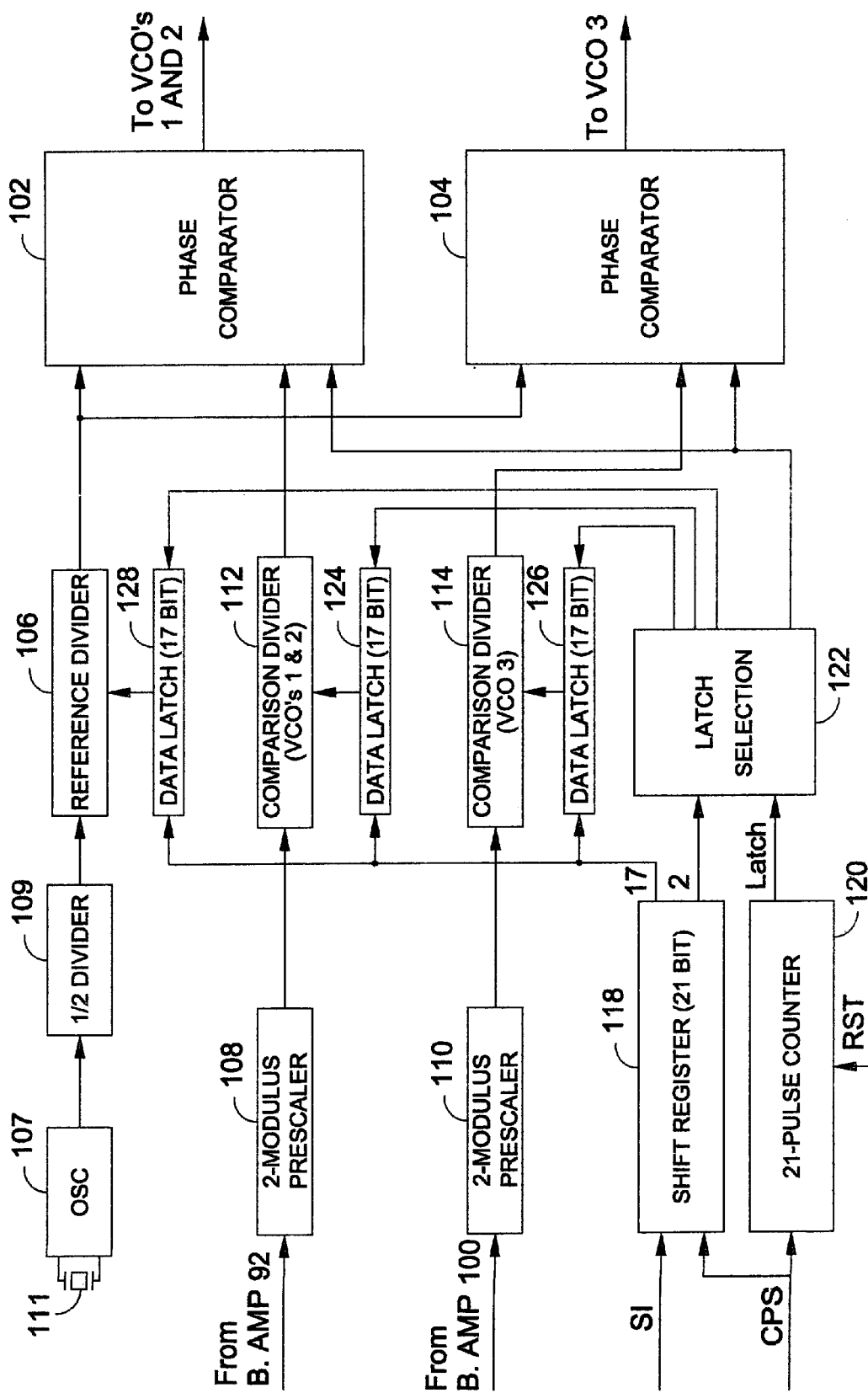
FIG. 4 illustrates a detailed block diagram of a PLL portion of the scanning radio receiver, as depicted in the block diagram of FIGS. 2 and 3.

FIG. 4 shows the detail of the PLL circuit 94. It includes two phase comparators, 102 and 104, the outputs of which are adapted to be connected to VCO's (1) and (2), and VCO (3), respectively. A single common reference divider 106, receiving the output of an oscillator 107 with a crystal 111 of 12.8 MHz through a ½ divider 109, is provided in the PLL circuit 94. The output of the single common reference divider 106 is applied to both of the phase comparators, 102 and 104.

Further, the PLL circuit 94 includes 2-modulus prescalers 108 and 110, comparison dividers 112 and 114, and the phase comparators 102 and 104. The 2-modulus prescalers 108 and 110, have divide values of $\frac{1}{128}$ and $\frac{1}{129}$, receive the outputs of the buffer amplifiers 92 and 100, respectively. The comparison dividers 112 and 114, receive the outputs of the 2-modulus prescalers 108 and 110, respectively. The outputs of the comparison dividers 112 and 114, are connected to the phase comparators 102 and 104, respectively. To the respective dividers 106, 112, and 114, 17-bit data latches 128, 124, and 126 are connected, respectively, which receive 17-bit data from a 21-bit shift register 118 and a latch selection signal from a latch selection circuit 122.

Figure 5:
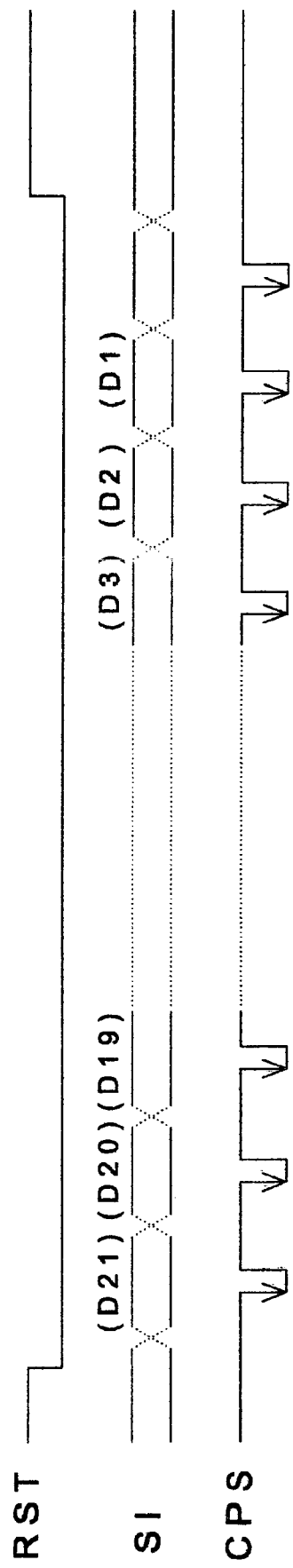
FIG. 5 illustrates waveforms applied from a CPU to a 21-bit shift register in the scanning radio receiver of the present invention.

The CPU 56 supplies the PLL circuit 94 with a serial data signal (SI), a clock pulse signal (CPS), and a reset signal (RST) through line 116. The data signal (SI) is applied to the 21-bit shift register 118, the clock pulse signal (CPS) to the shift register 118 and a 21-pulse counter 120, and the reset signal (RST) to the counter 120. As shown in FIG. 5, when the reset signal (RST) applied to the counter 120 is "L", the data signal (SI) applied to the shift register 118 is read sequentially into the shift register 118 in response to trailing edges of the clock pulse signal (CPS). The whole data (D21–D1) is set in the shift register 118 in response to the trailing edge of the 21st clock pulse signal (CPS). The 22nd clock pulse signal (CPS) and signals thereafter, are made invalid.

Figure 6:
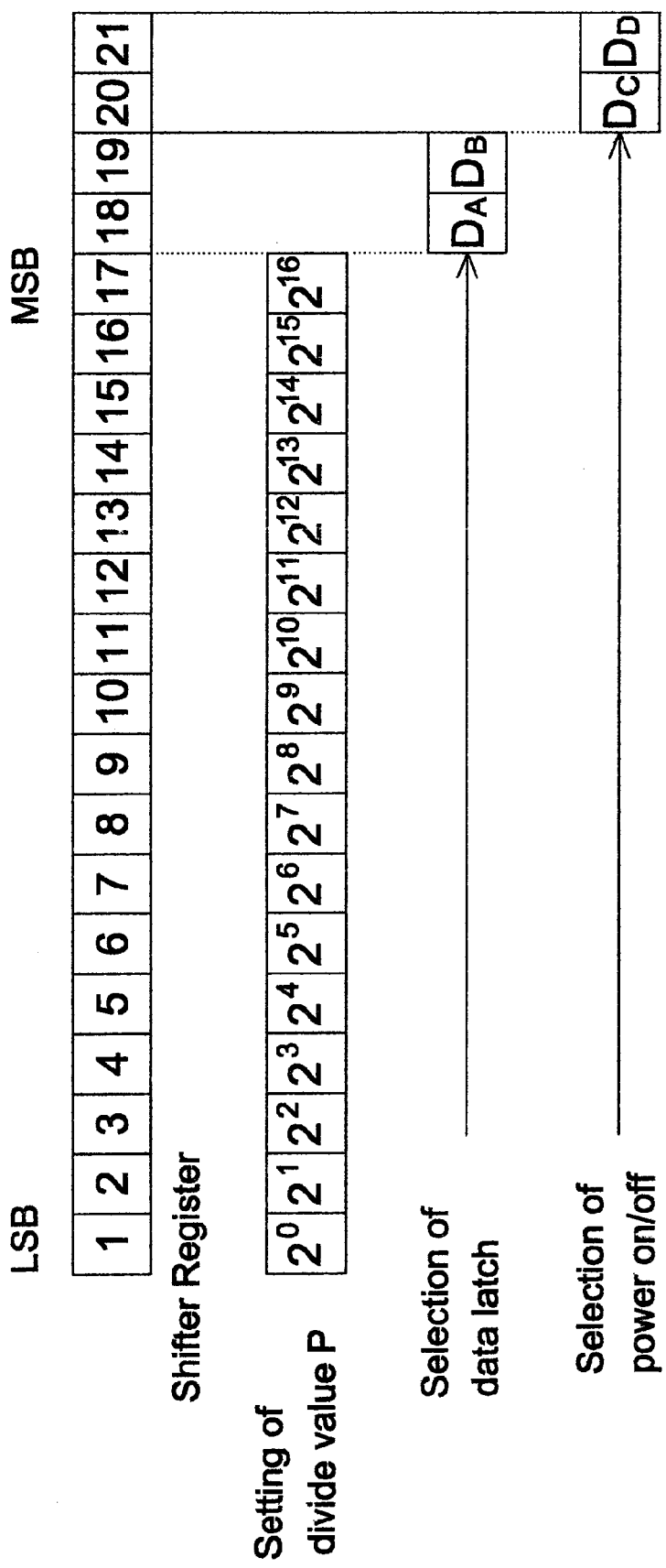
FIG. 6 shows a view for explaining data contents from the CPU to the 15 shift register in the scanning radio receiver of the present invention.

FIG. 6 shows the contents of the data fetched within the shift register 118. The divide value P of the dividers 106, 112, and 114, is represented by a 17-bit binary code, the maximum divide value N(fREF) of the reference divider 106 is N(fREF)=2×P (provided that P=16~2,047), and the maximum divide value N(vco) of the comparison dividers, 112 and 114, is N(vco)=P (provided that P=16384~131071).

The selection of a data latch to be updated is made with two bits, $D_A$ and $D_B$. The 2-bit data, from the shift register 118, is applied to a latch selection circuit 122 together with a latch signal from the 21-pulse counter 120. On the basis of this output, for example, when $D_A$ is "H" and $D_B$ is "L", the data of the latch 124 for the comparison divider 112 (VCO's (1) and (2)) is updated, when $D_A$ is "L" and $D_B$ is "H", the data of the latch 126 for the comparison divider 114 (VCO (3)) is updated, and when $D_A$ and $D_B$ are both "H", the data of the latch 128 for the reference divider 106 is updated.

Additionally, two bits, $D_C$ and $D_D$, enable the setting of power ON/OFF for the circuit elements of the PLL system in FIG. 4. For example, when $D_C$ is "L" and $D_D$ is "L", the circuit portion for the VCO's (1) and (2) and the circuit portion for the VCO (3) are both activated. When $D_C$ is "H" and $D_D$ is "L", only the circuit portion for the VCO's (1) and (2) is activated.

When Dc is "L" and DD is "H", only the circuit portion for the VCO (3) is activated. Finally, when Dc is "H" and DD is "H", both of the circuit portion for the VCO's (1) and (2) and the circuit portion for the VCO (3) are deactivated.

For example, if the data for setting the divide value of the shift register 118 is L(LSB), L, L, L, L, L, H, H, H, L, H, H, H, L, H, L, L(MSB), DA and DB are "H" and "L", respectively, (this condition selects the latch 124), and Dc and DD are "H" and "L", respectively, (this condition activates only the circuit portion for the VCO's (1) and (2)), then the divide value P of the comparison divider 112 is;

$$P = 2^6 + 2^7 + 2^8 + 2^{10} + 2^{11} + 2^{12} + 2^{14} = 24,000.$$

Also, in case where the frequency to be compared to the reference divider 106 is set to 12.5 KHz, when the PLL 94 was locked, $$fvco(1)=12.5\ KHz \times 24,000=300,000\ KHz=300\ MHz.$$

Figure 7:
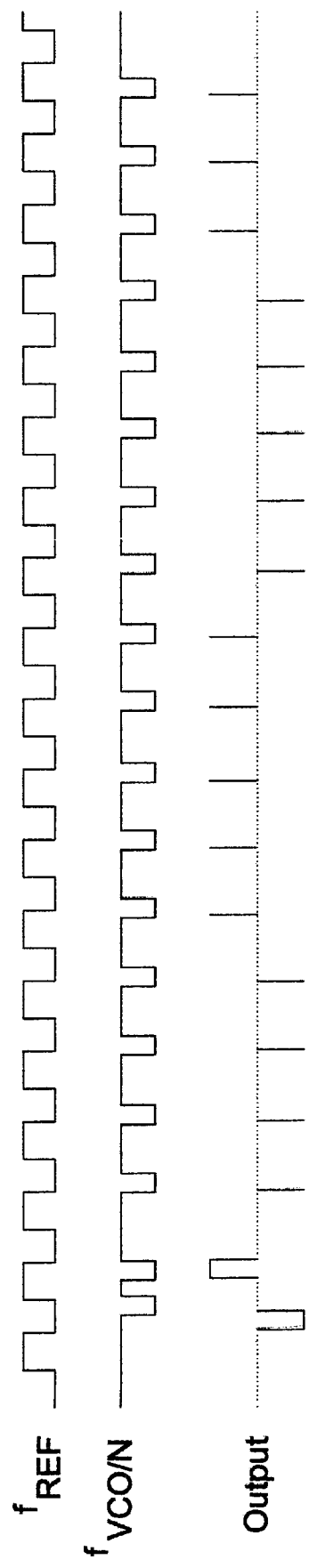
FIG. 7 shows waveforms for explaining the operation of a phase detector shown in FIG. 4.

FIG. 7 shows the output (fREF) of the reference divider 106, indicated as "fREF", the output (fvco) of the comparison divider, 112 or 114, indicated as "Fvco/N", and the output of the phase comparator, 102 or 104, indicated as "output". The phase comparator 102 compares the phases of the reference divider 106 output (fREF) and the comparison divider 112 output (fvco). The phase comparator 104 compares the phases of the reference divider 106 output (fREF) and the comparison divider 114 output (fvco). When the phase of fvco is lagging with respect to the phase of fREF, the phase comparator, 102 or 104, provides a "L" output state, and when the phase of fvco is leading with respect to the phase of fREF the phase comparator, 102 or 104, provides a "H" output state. When the phase of fvco is in phase with phase fREF, the phase comparator, 102 or 104, provides a high impedance output. The symbol " . . . " identifies a high impedance state.

Figure 8:
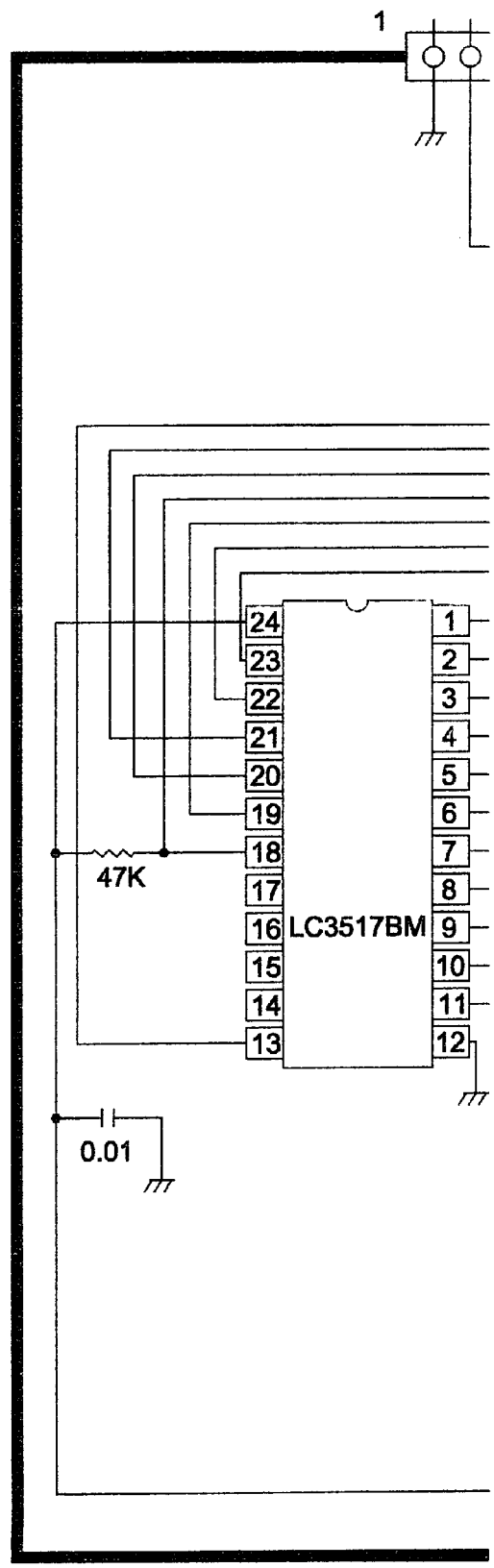
FIGS. 8, 9, and 10 illustrate, in combination, a detailed circuit diagram of the scanning radio receiver of the present invention shown in the block diagram in FIGS. 2 and 3.
Figure 9:
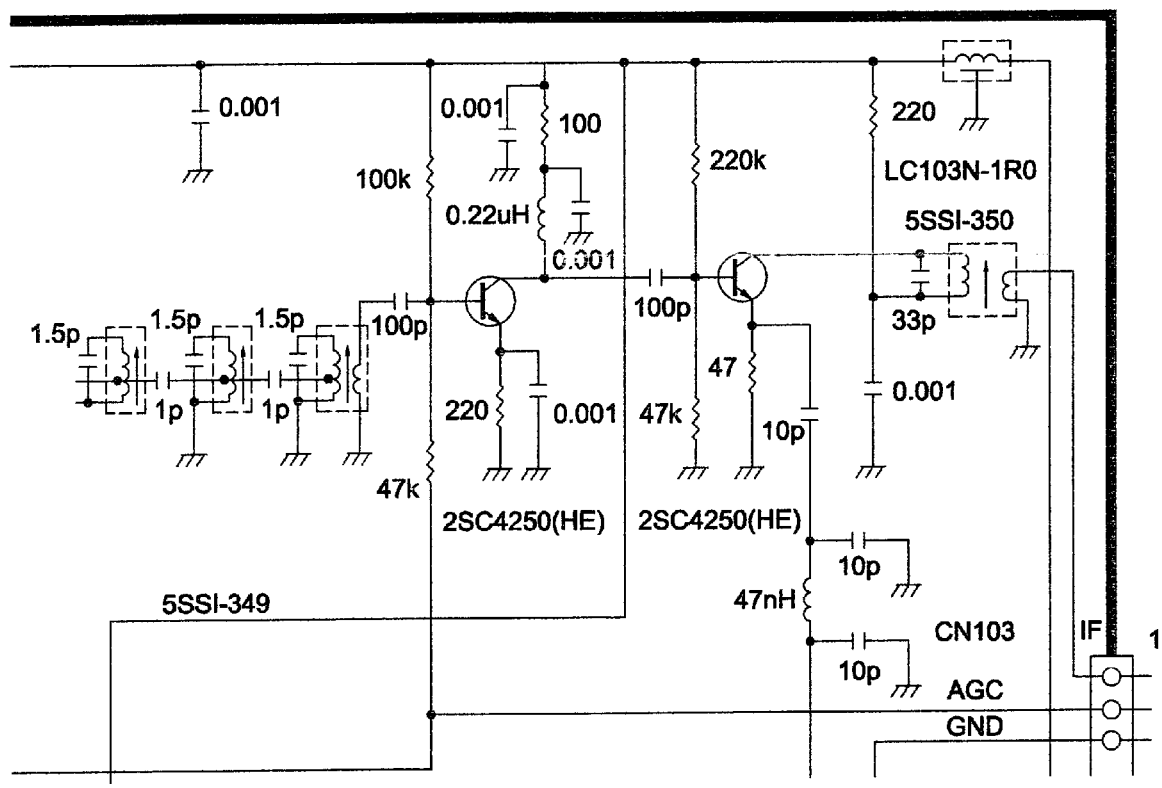
Figure 10:
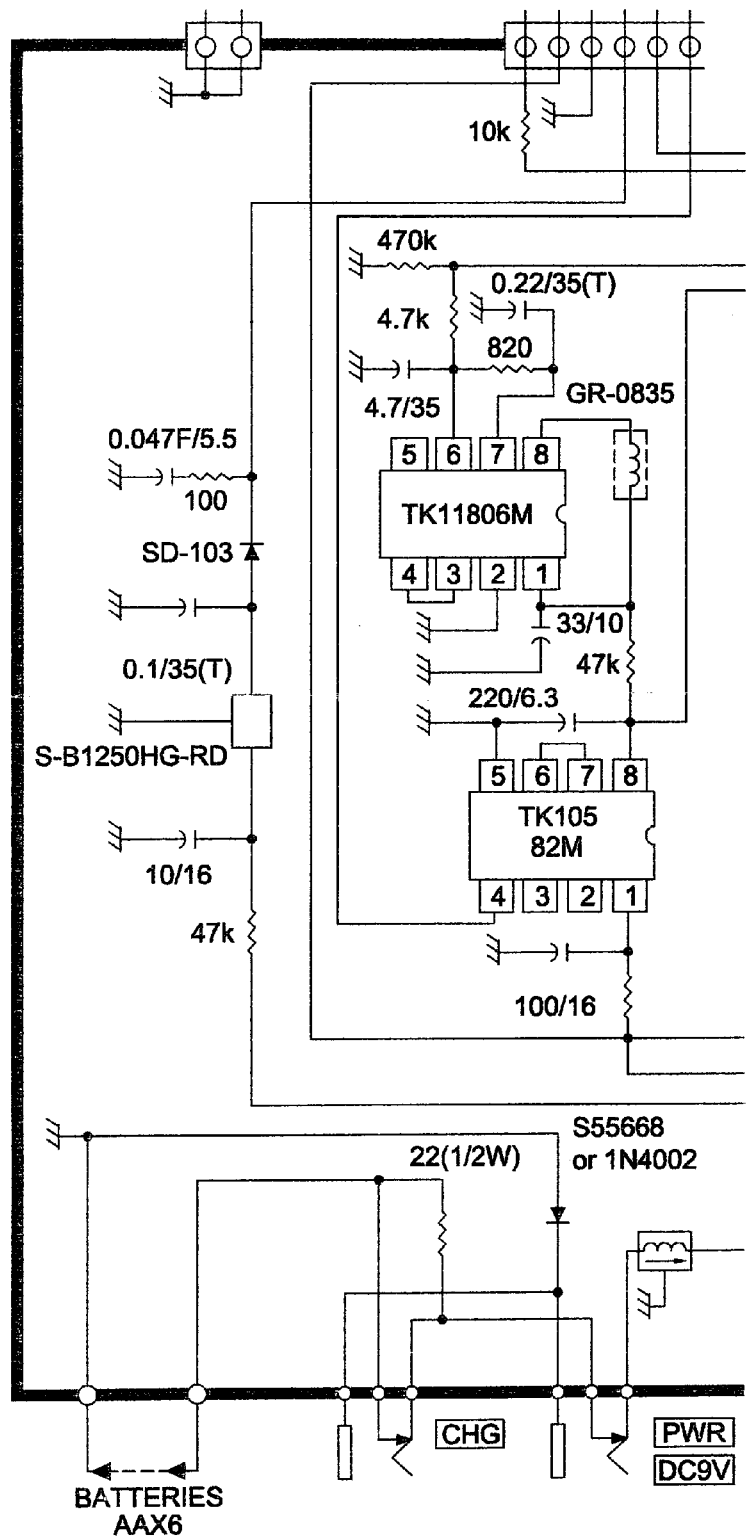

FIGS. 8, 9, and 10 show a detailed circuit diagram of the scanning radio receiver 11 as depicted by the block diagrams in FIGS. 2 and 3. Circuit portions in FIGS. 8 and 9 substantially correspond to the block diagram in FIG. 2. Circuit portions in FIG. 10 substantially correspond to the block diagram in FIG. 3.

The circuit portion in FIG. 8 has connectors CN1, CN2, CN3, and CN4 which are adapted to be connected to connectors CN101 and CN102 in the circuit portion in FIG. 9, and connectors CN303 and CN304 in the circuit portion in FIG. 10. A connector CN103 in the circuit portion in FIG. 9 is adapted to be connected to a connector CN301 in the circuit portion in FIG. 10.

The CPU 56, depicted in FIG. 2, corresponds to IC2 in FIG. 8. The pin arrangement of this IC and functions assigned to these pins are shown in FIG. 12.

The keyboard 57, depicted in FIG. 2, is shown by 24 key switches labeled AM/FM, SCAN, MAN(UAL), PRI (ORITY), DOWN (▼), L/0, LIM(I)T, P(RO)G(RA)M, MON(ITOR), DEL(AY), UP (▲), CL(EAR), ENT(ER), TEN KEYS 0–9 (number keys), and a DECIMAL POINT KEY, in FIG. 8. Additionally, FIG. 8 shows a KEYLOCK switch SW1. The KEYLOCK switch disables the keypad (except for the SCAN and MAN keys) to prevent accidental program changes. The SCAN key starts scanning through stored channels. The PRI key turns the priority function on and off. The L/O key turns the selected channel's lockout function on and off. The DEL key turns the selected channel's delay feature on and off. The MAN key stops scanning and enables direct entering of a channel number. The LIMT key turns on the limit mode and sets the frequency range. The UP and DOWN keys select the search direction. The MON key accesses ten monitor memories. Each key of the number keys has a single-digit label key and a range of numbers above each key, the single-number digit key is used to enter the numbers for a channel or a frequency, while the range of numbers above the key (for example, 81–100) are utilized for selecting the channels in a channel-storage bank. The ENT key stores a frequency in a channel. The AM/FM key switches the scanner between the AM and FM modes. The PGM key sets the scanner so frequencies can be stored in channels. The CL key clears an incorrect entry and is used when initializing the scanner.

Additionally, FIG. 8 shows a LCD display for displaying the operation status of the scanner radio receiver 11. A "P" symbol is illuminated when the receiver 11 is turned to a priority channel. A "MON" symbol is illuminated when the receiver 11 is turned to a monitor memory. A "BANK" symbol is illuminated when the memory banks are turned on during the scan mode. A "ch" symbol is illuminated when the receiver 11 is turned to one of the 200 available channels. An "FM" or "AM" symbol is steadily illuminated when the receiver 11 automatically selects the FM or AM mode, and blinks when the FM or AM mode is manually selected. A "SCAN" symbol is illuminated while the receiver 11 is scanning channels. A "SRCH" symbol is illuminated while the receiver 11 is searching up or down the frequency bands. An "▲" and "▼" symbol indicate the direction of a search. A "MAN" symbol is illuminated when a channel is manually selected. A "PGM" symbol is illuminated when frequencies are being stored into the receiver's channels. A "PRI" symbol is illuminated when the priority channel feature is turned on. A "DLY" symbol is illuminated when the receiver 11 is set to a channel pre-programmed with the delay feature. A "L/O" symbol is illuminated when the channel which is being listened to is locked out of the scan mode.

The scanning radio receiver 11 can store up to 210 frequencies into the memory. Each station's frequency is stored into either a permanent memory, called a channel memory, or a temporary memory, called a monitor memory. There are 200 channel memories and ten monitor memories. To make it easier to group and select channels, the channel memories are divided into 10 channel storage banks of 20 channels each. The 10 monitor memories can be used to temporarily store frequencies while the operator decides whether or not to save them in channels.

The scanning radio receiver 11 can be set to search for: (1) transmissions within a limited range of specified frequencies (limit search), and/or (2) transmissions starting from a designated frequency (direct search). During the limit search, the scanner searches upward starting from a selected lower frequency limit or downward starting from a selected upper frequency limit. During the direct search, the scanner searches upward or downward, starting from a specified frequency.

Figure 11:
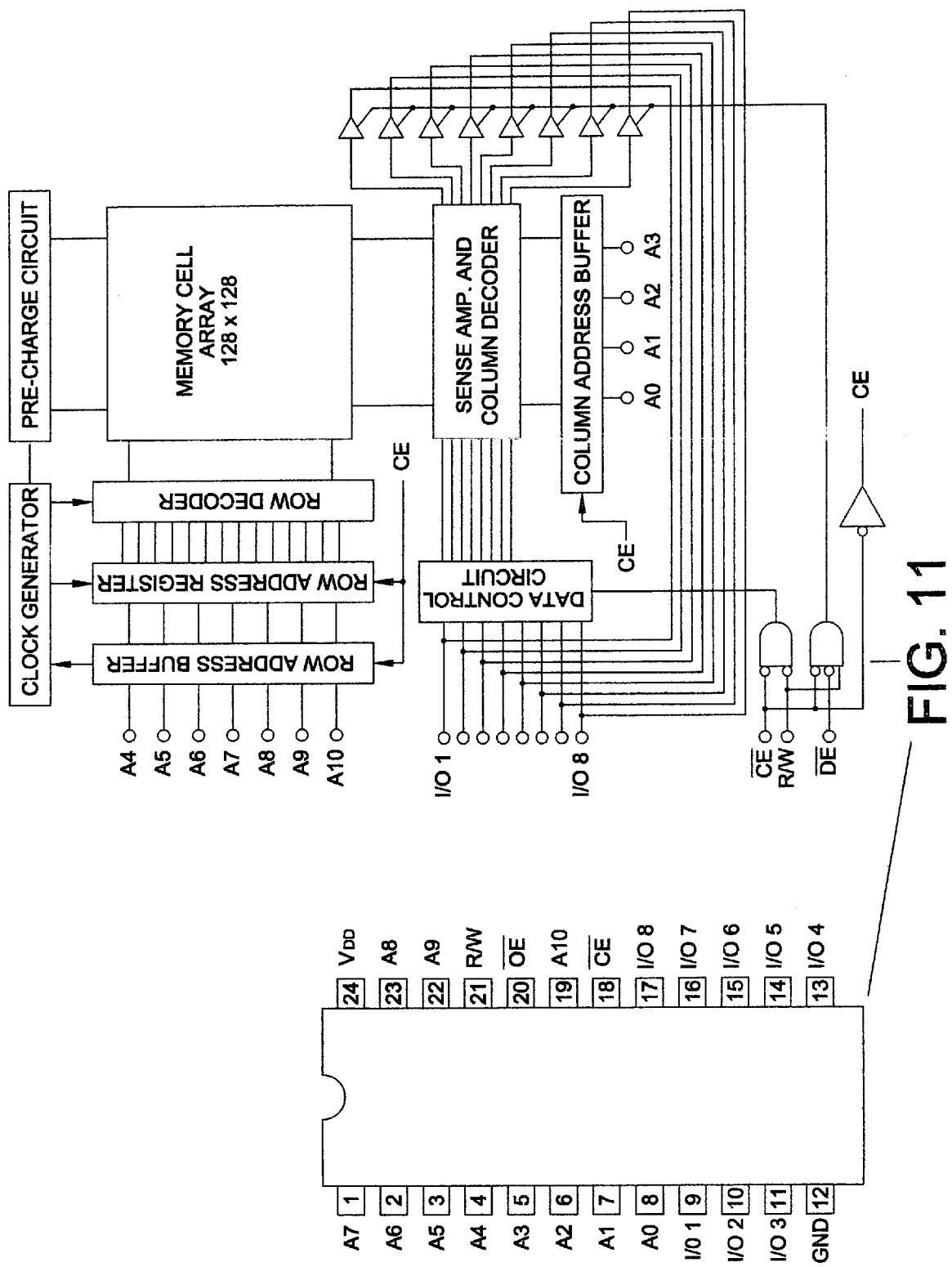
FIG. 11 illustrates the pin arrangement and functional block diagram of IC1 as used in FIG. 8.
Figure 13:
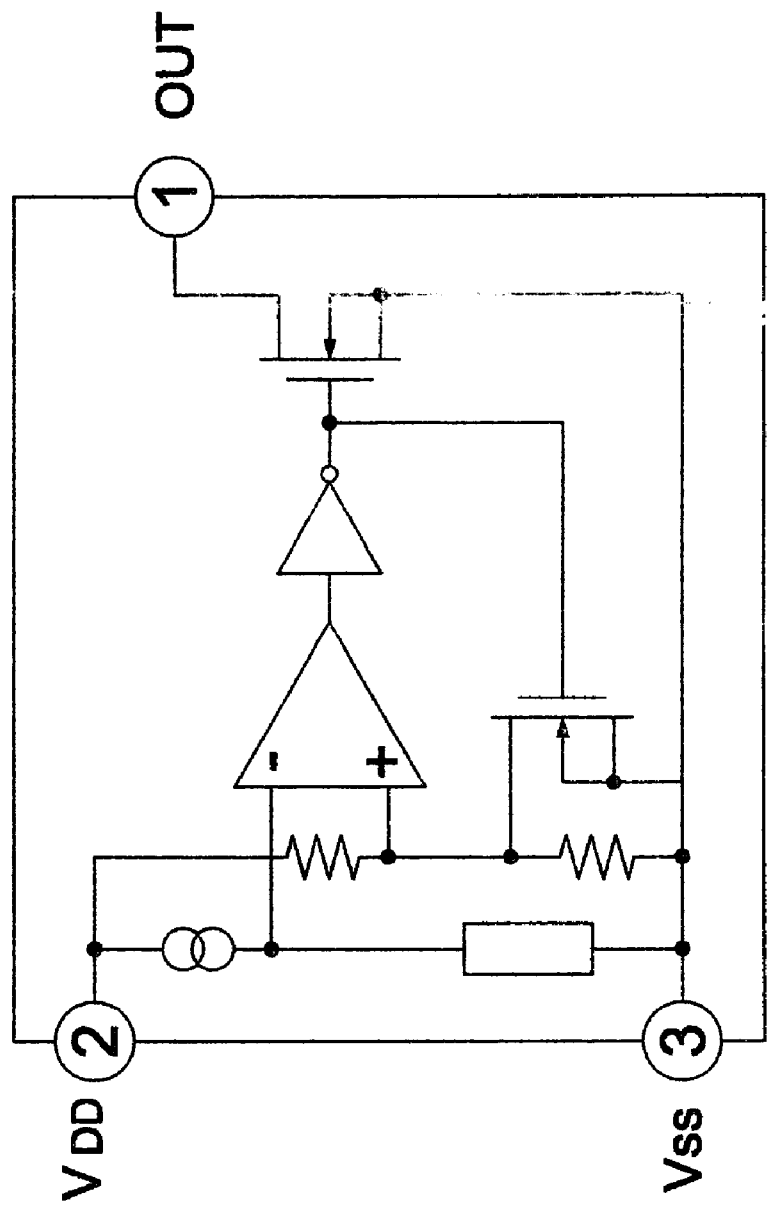
FIG. 13 illustrates the functional circuit diagram of IC3 and IC4 as used in FIG. 8.

FIG. 11 shows the pin arrangement of IC1, as shown in FIG. 8, and its functional block circuit. This IC is a fully synchronous silicon gate CMOS static RAM organized as 2,048 words×8 bits, and includes address inputs A0 to A10, a read/write control input WE-bar, an output enable input OE-bar, a chip enable input CE-bar, and data inputs/outputs I/O1 to I/O8. IC1 is of the IC type LC3517BC manufactured and sold by Sanyo Electric Co. Ltd., and was utilized as IC1 in the embodiment of the invention. IC3 and IC4, as shown in FIG. 8, are shown in their functional block view in FIG. 13. IC3 and IC4 are of the IC type S-9054HN manufactured and sold by Seiko Electronics Industry K.K., which is designed to function as a voltage detector comprising a reference voltage source, a comparator, a hysteresis circuit, an output driver, etc.

Figure 22:
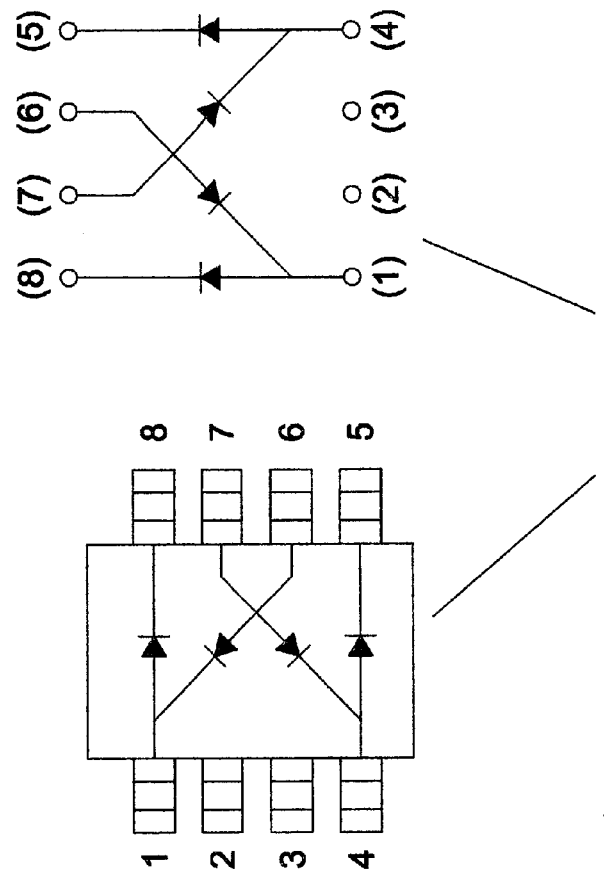
FIG. 22 illustrates the pin arrangement and diode connection diagram of D112 in FIG. 9.

In FIG. 9, the band-pass filter 52, as shown in FIG. 2, is shown as four band-pass filter portions related to their switching circuit (QI0I–QI04). The RF amplifier 58, as shown in FIG. 2, comprises transistors Q105 and Q106, and related circuit parts as shown in FIG. 9. The first mixing means 60, as shown in FIG. 2, comprises mainly D112 in FIG. 9, the pin arrangement and internal structure of which are shown in FIG. 22. The first IF amplifier 62, as shown in FIG. 2, comprises transistors Q109 and Q110 and related circuit parts as depicted in FIG. 9. The second mixing means 64, as shown in FIG. 2, comprises a transistor Q111 and related circuit parts as shown in FIG. 9.

Figure 14:
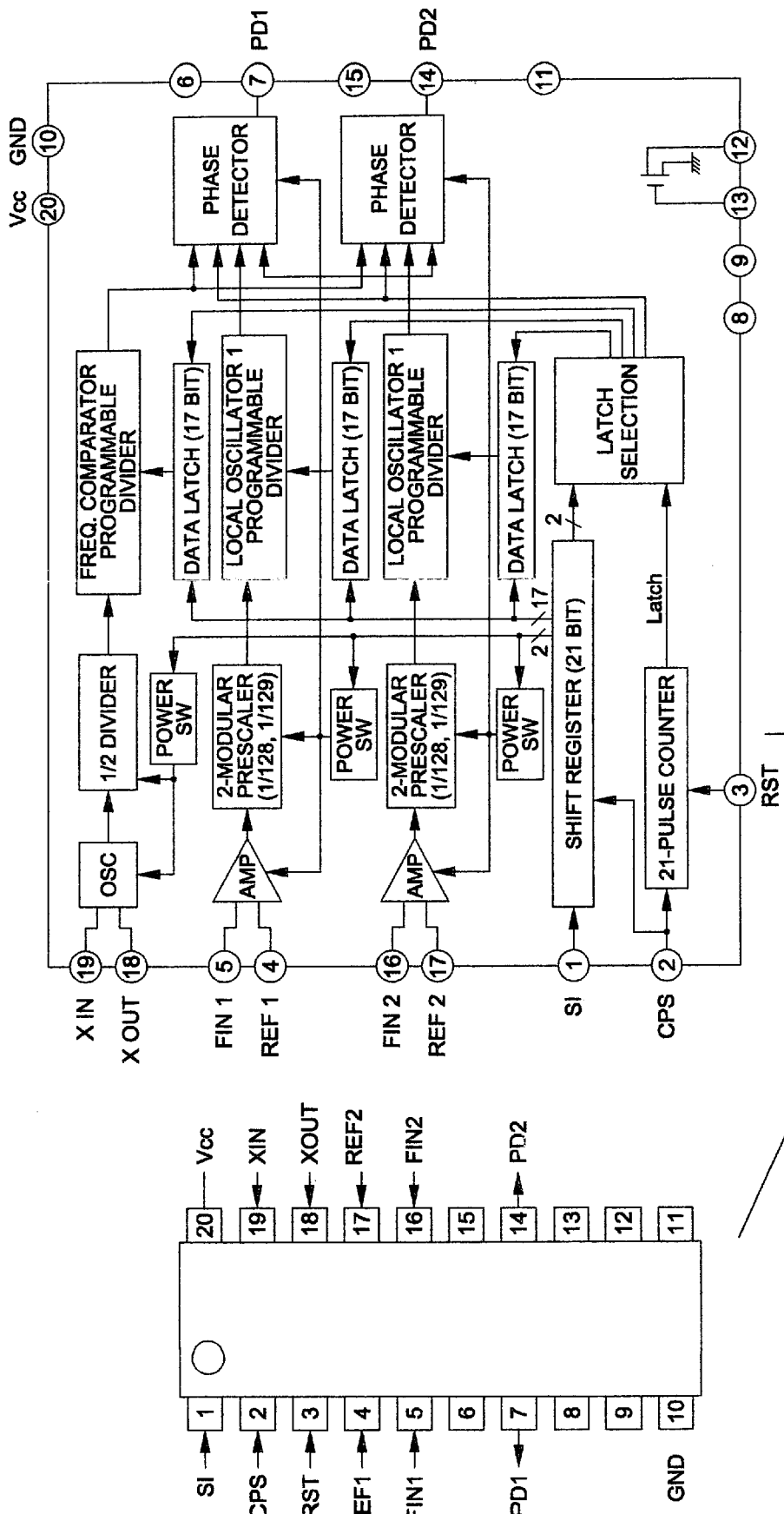
FIG. 14 illustrates the pin arrangement and functional block diagram of IC101 as used in FIG. 9.

The PLL circuit 94, as shown in FIG. 2, shown in more detail in FIG. 4, is comprised of IC101 in FIG. 9, the pin arrangement and functional block diagram of which are shown in FIG. 14. In the functional block diagram of the PLL 94 shown in FIG. 14, the phase comparators 102 and 104, reference divider 106, and comparison dividers 112 and 114 of FIG. 4, are denoted as PHASE DETECTORS, FREQ. COMPARATOR PROGRAMMABLE DIVIDER, and LOCAL OSCILLATOR 1 and 2 PROGRAMMABLE DIVIDERS, respectively. Additionally, power switches are provided receiving 2-bit data from the shift register 118, one activating the oscillator (OSC) 107, the second activating the prescaler 108, a preceding amplifier 92 and the phase comparator 102, and the third activating the prescaler 110, a preceding amplifier 100 and the phase comparator 104, as shown in FIG. 4.

The VCO (1) 88, of FIG. 2, comprises mainly a transistor Q112, as shown in FIG. 9, and is controlled by a switching circuit comprising a transistor Q113 and related parts. The VCO (2) 90, of FIG. 2, comprises mainly a transistor Q114, as shown in FIG. 9, and is controlled by a switching circuit comprising a transistor Q115 and related parts.

The buffer amplifier 92, of FIG. 2, comprises transistors Q116 and Q117 and related circuit parts as shown in FIG. 9.

The low-pass filter 96, of FIG. 2, comprises transistors Q118 and Q119 and related circuit parts as shown in FIG. 9.

The VCO (3) 98, of FIG. 2, comprises mainly a transistor Q121, as shown in FIG. 9, and is controlled by a switching circuit comprising a transistor Q122 and related parts.

The buffer amplifier 100, of FIG. 2, comprises transistors Q120 and related circuit parts as shown in FIG. 9.

The circuit diagram of FIG. 10 includes various integrated circuits. IC301 is an FM demodulation circuit, the pin arrangement and functional block diagram of which is shown in FIG. 15. The FM demodulation circuit includes an oscillator, a mixer, a limiting amplifier, a quadrature discriminator, an active filter, a squelch control, and a mute switch. An IC of the type MC3361, manufactured by Samsung Semiconductor, was used as IC301.

Figure 16:
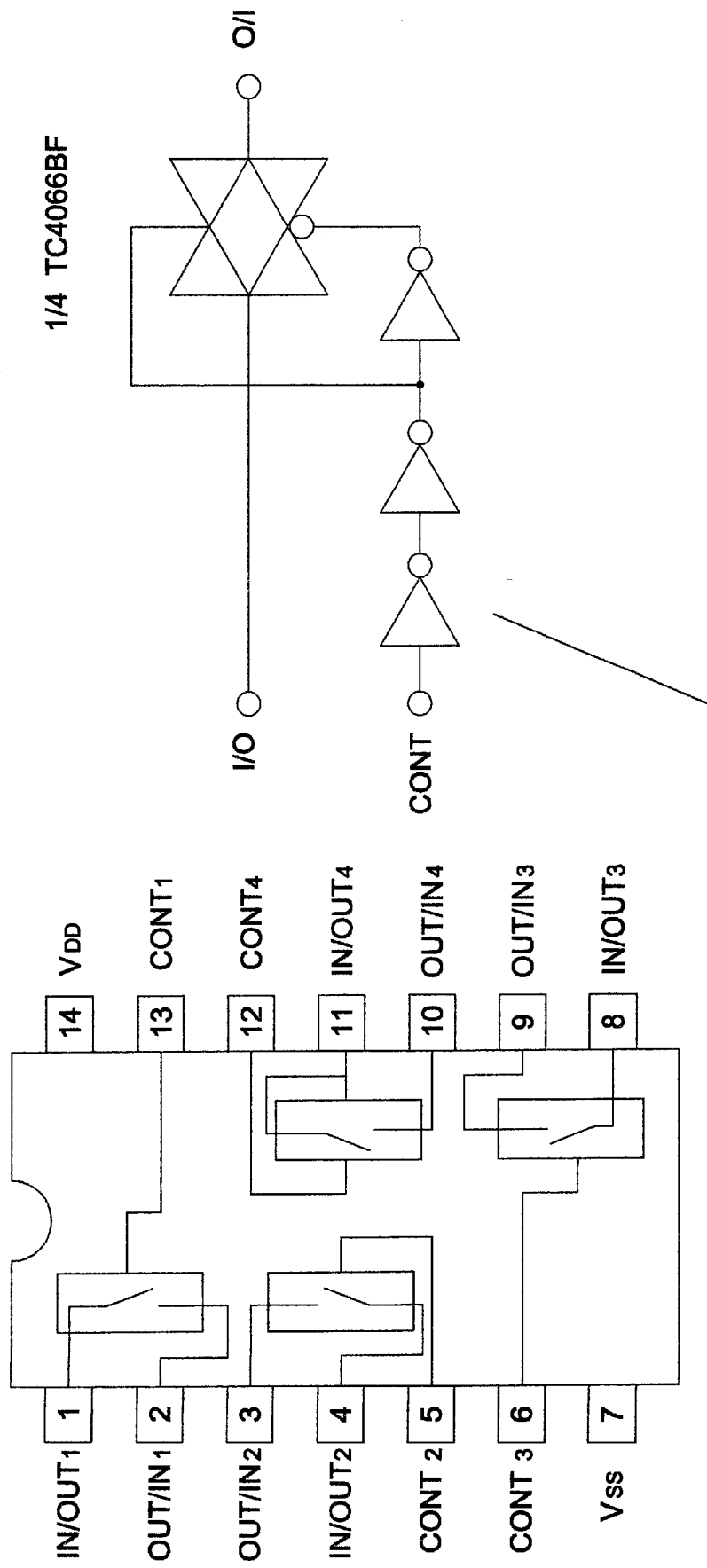
FIG. 16 illustrates the pin arrangement and functional block diagram of IC302 as used in FIG. 10.

IC302 is a quad bilateral switch circuit, the pin arrangement and functional block diagram of which is shown in FIG. 16. The quad bilateral switch circuit has control inputs which provide a low impedance state between input and output terminals when it receives "H" signal, and a high impedance state between the input and output terminals when it receives "L" signal.

Figure 17:
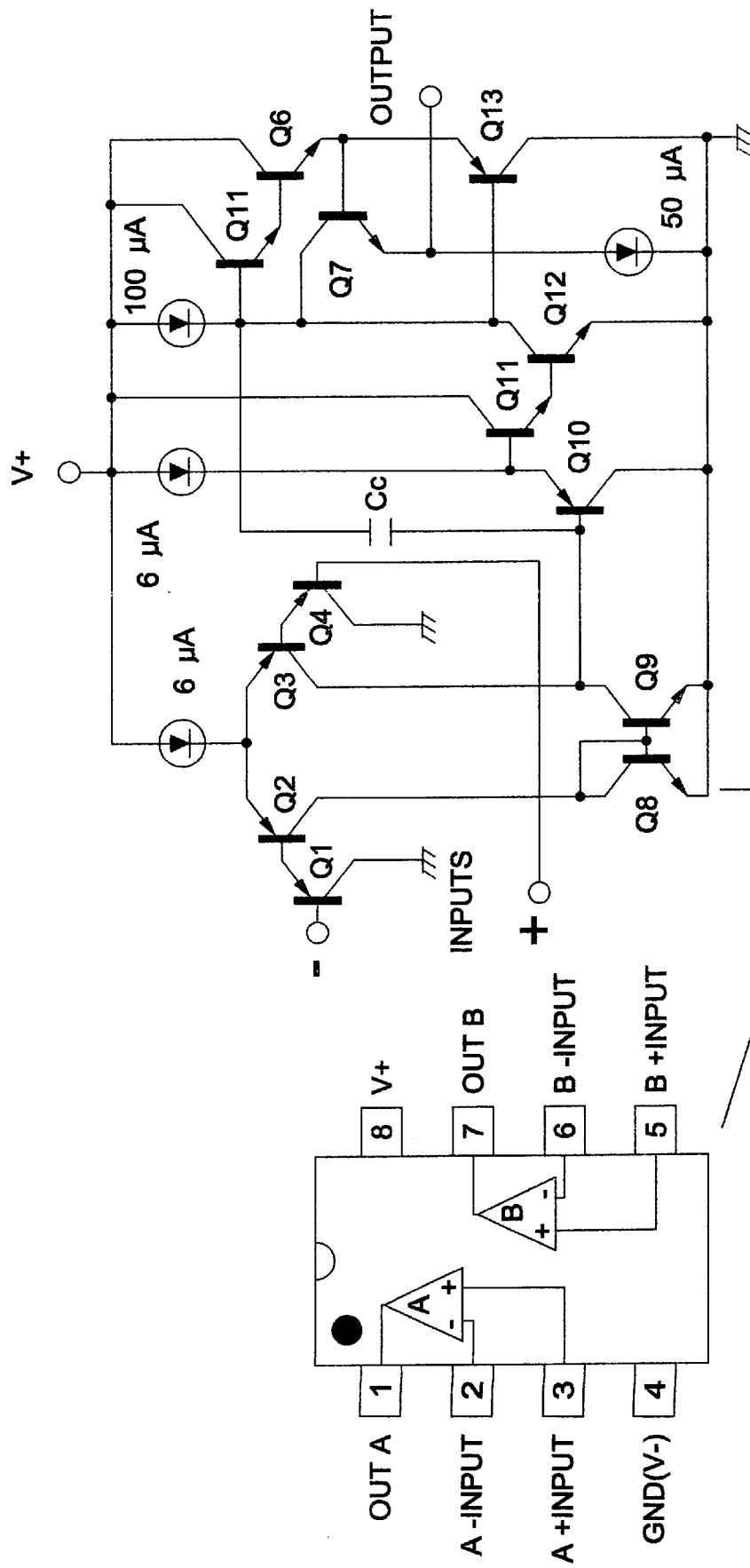
FIG. 17 illustrates the pin arrangement and functional block diagram of IC303 as used in FIG. 10.

IC303 is a dual ground sense operational amplifier circuit, the pin arrangement and functional circuit diagram of which is shown in FIG. 17. The dual ground sense operational amplifier circuit includes two independent operational amplifiers.

Figure 18:
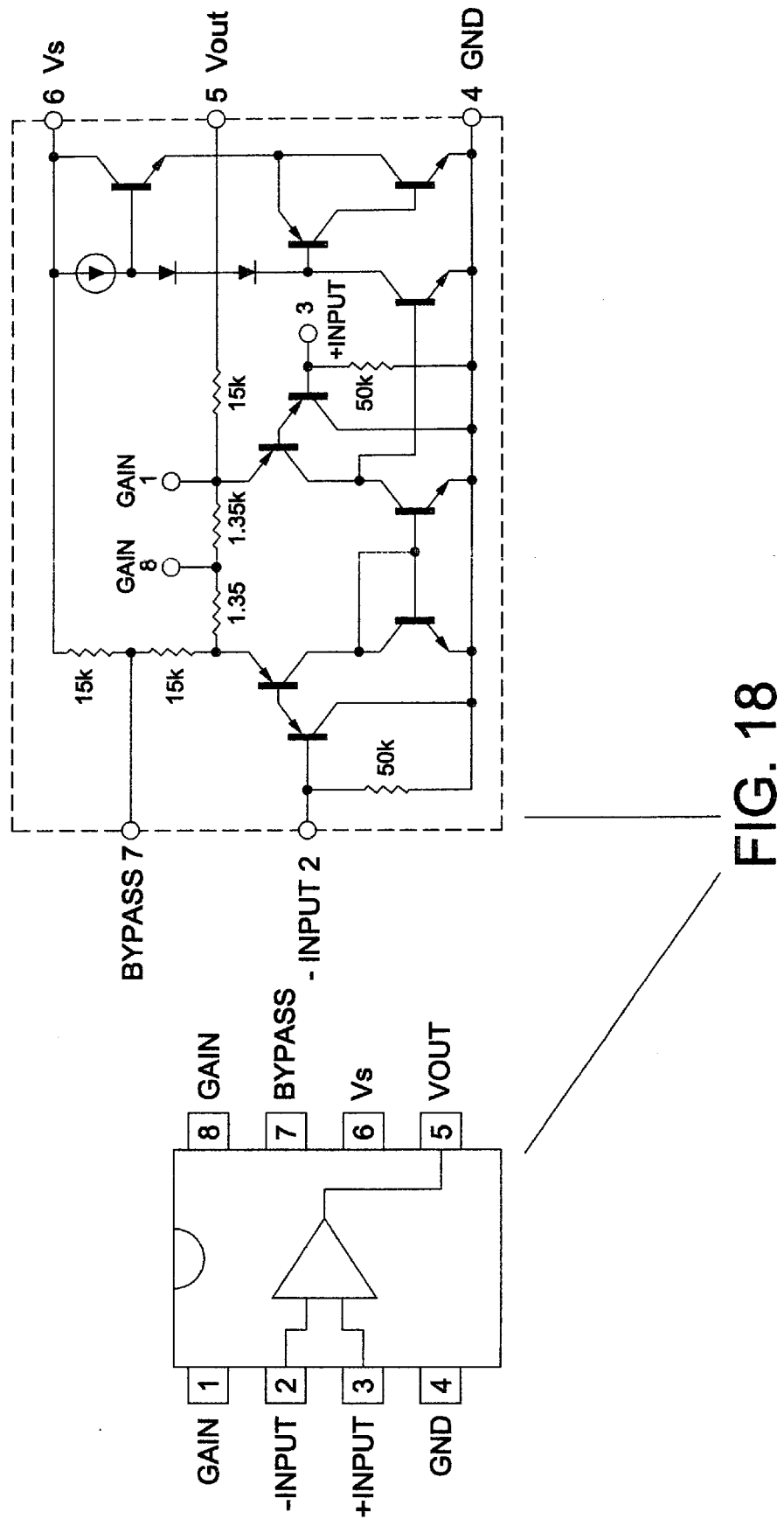
FIG. 18 illustrates the pin arrangement and functional block diagram of IC304 as used in FIG. 10.

IC304 is an audio power amplifier circuit, the pin connection and functional circuit of which is shown in FIG. 18. An IC of the type LM386, manufactured by National Semiconductor Corporation, was used as IC304.

Figure 19:
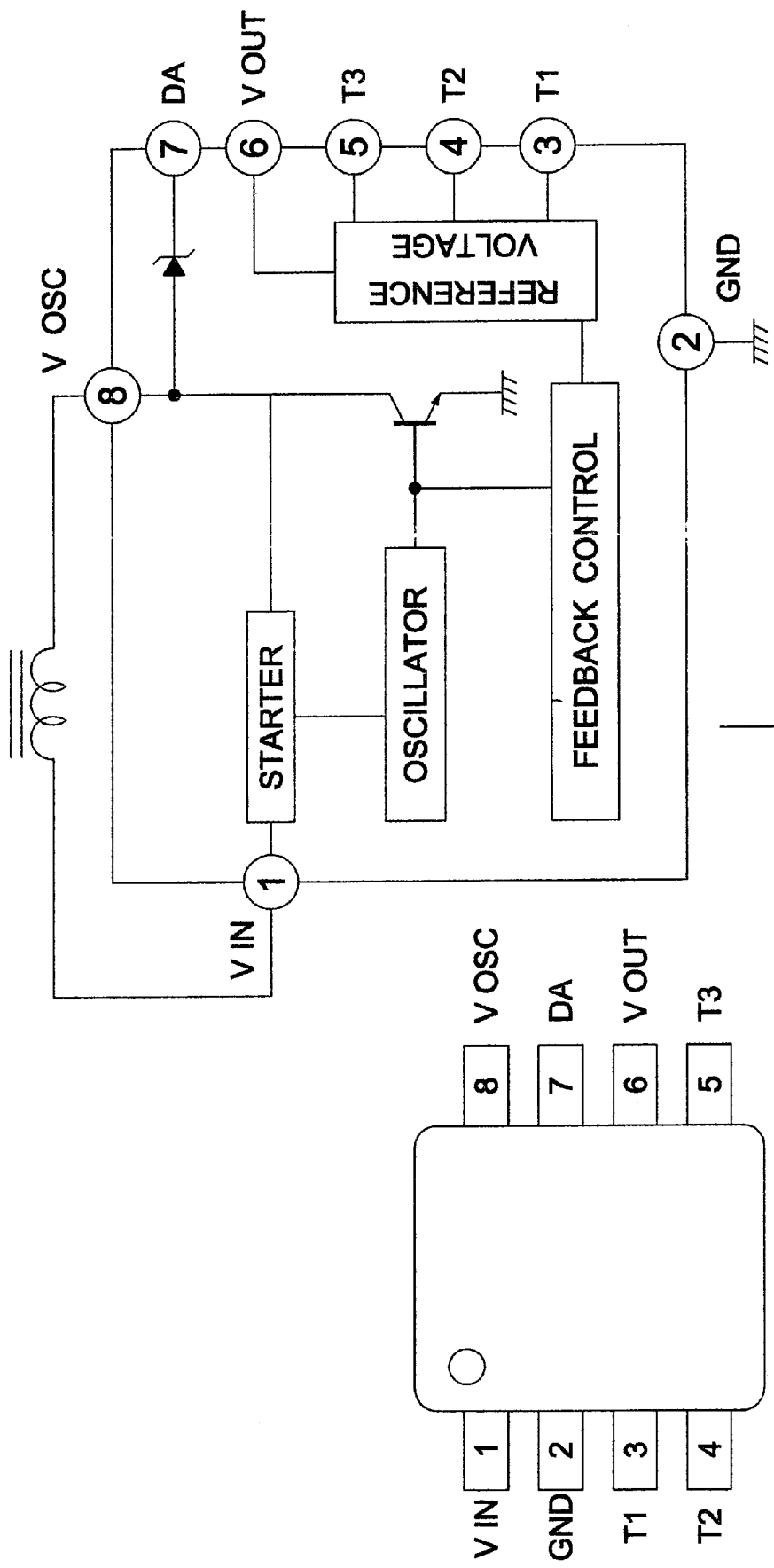
FIG. 19 illustrates the pin arrangement and functional block diagram of IC305 as used in FIG. 10.

IC305 is a DC—DC converter, the pin connection and functional block diagram of which is shown in FIG. 19. The DC—DC converter IC305 generates 32 volt output DC voltage at pin 6, from 4.5 volt input DC voltage in pin 1, which is applied to the lowpass filter 96.

Figure 20:
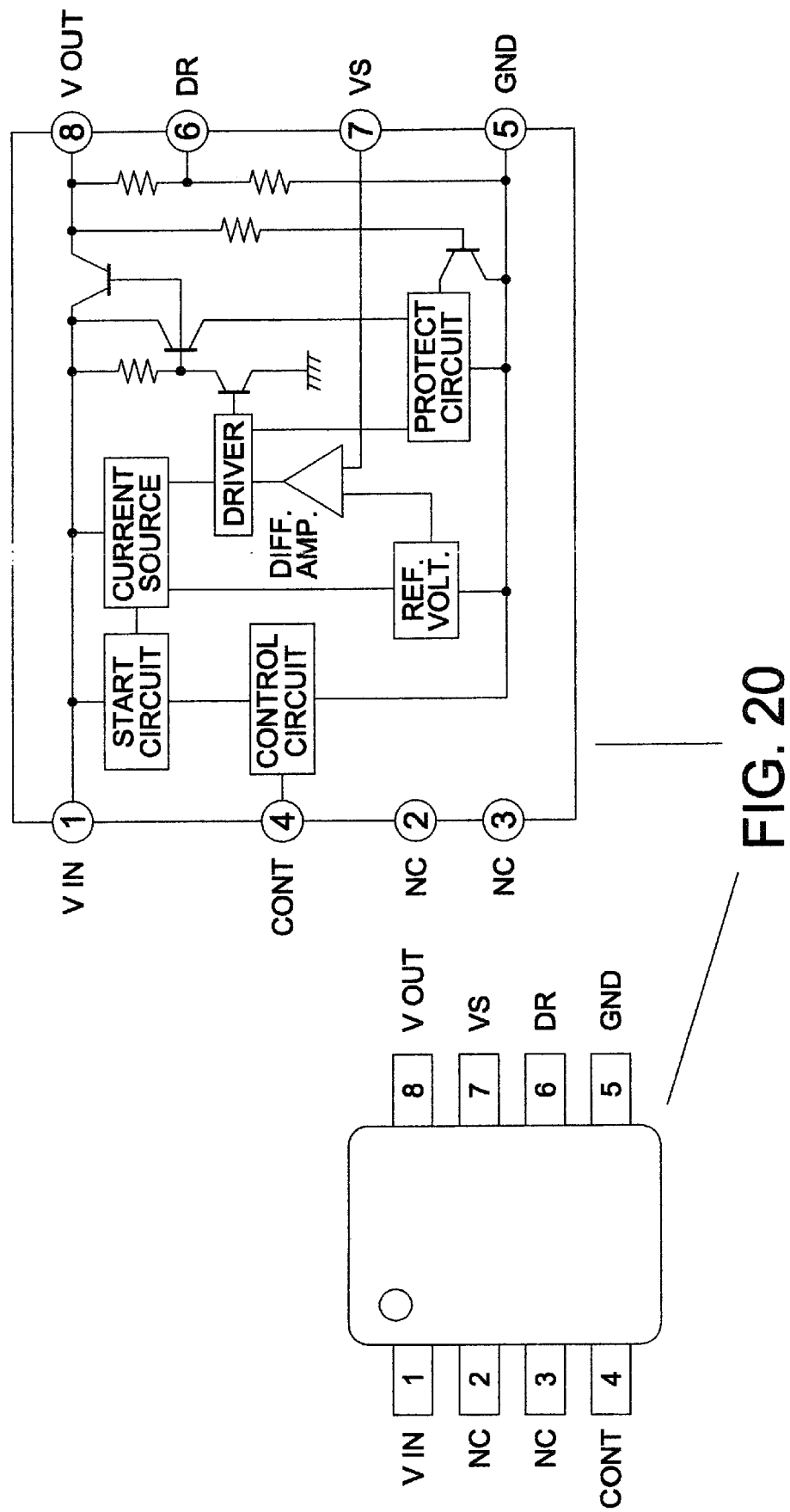
FIG. 20 illustrates the pin arrangement and functional block diagram of IC306 as used in FIG. 10.

IC306 is a local regulator IC, the pin outline and functional block diagram of which is shown in FIG. 20. The local regulator IC provides an output of 5 volts DC voltage to the DC—DC converter (IC305).

Figure 21:
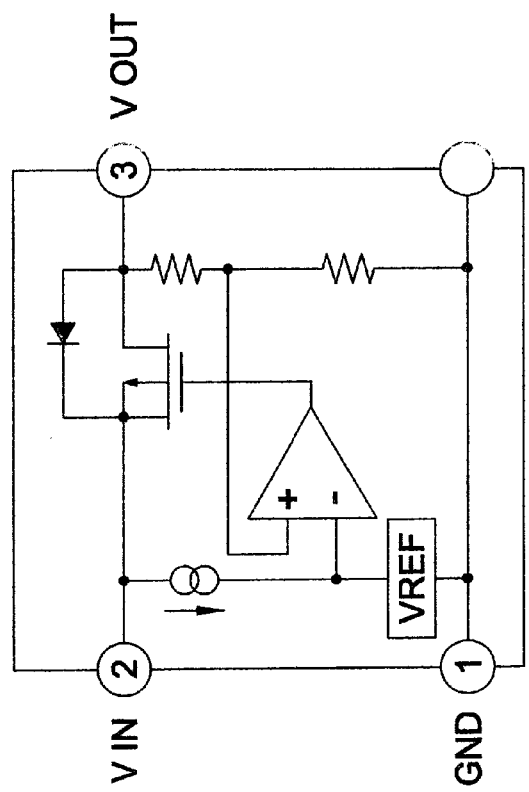
FIG. 21 illustrates the functional block diagram of IC307 as used in FIG. 10.

IC307 is a voltage regulator, the pin layout and functional block diagram of which is shown in FIG. 21. The voltage regulator provides 5 volts DC voltage to the IC2 (CPU 56) of FIG. 8.

The second IF amplifier 66, of FIG. 3, corresponds mainly to a transistor Q301 and a crystal filter XF301 as shown in FIG. 10.

The third mixing means 66, of FIG. 3, is formed by the mixer portion in IC301 as shown in FIG. 15.

The oscillator (OSC) 70, of FIG. 3, corresponds to the oscillator portion in IC301 and a crystal X301 of 20.945 MHz as shown in FIG. 10.

The limiter amplifier 74, demodulator 76, and audio frequency amplifier 78, of FIG. 3, correspond to the limiter amplifier portion, demodulator portion, and AF amplifier portion in IC301, respectively, shown in FIG. 15.

The AM/FM switching circuit 80, of FIG. 3, corresponds to three switch circuit portions in IC302 shown in FIG. 16.

The AM IF amplifier 82, of FIG. 3, is mainly comprised of transistors Q302 and Q303 shown in FIG. 10.

The AM detector 84, of FIG. 3, comprises mainly a diode D302 shown in FIG. 10.

The output signal from the AM/FM switching circuit 80 of FIG. 3 is applied through a pre-amplifier comprising mainly transistor Q304, to the audio amplifier 86 comprising IC304 in FIG. 18.

The detailed circuit of the scanner radio receiver 11, shown in FIGS. 8, 9, and 10, includes various circuit portions which are not shown in the block diagrams of in FIGS. 2 and 3. One of these circuit portions is an automatic gain control (AGC) amplifier, comprised of transistors Q107 and Q108 and related circuit elements. The AGC amplifier receives 455 KHz output from the AM IF amplifier 82 and generates an AGC output signal for controlling the RF amplifier 58.

Another circuit portion is a squelch circuit. A squelch signal is comprised of a noise product from the demodulated output of the AF amplifier 78, namely the AF amplifier portion in IC301. It is level-controlled by a potentiometer VR301 and amplified by a filter amplifier portion in IC301, and thereafter it enters into a "SQUELCH TRIGGER WITH HYSTERESIS" circuit in IC301 in order to control AF mute and scanning. An output from this circuit (pin 13 of IC301) is input to the CPU 56. A mute signal from the CPU 56 is applied to a mute circuit comprising mainly a transistor Q305 to control the audio amplifier 86.

Yet another circuit portion is a Zeromatic circuit generally comprising IC303 and one switching circuit portion (¼) in IC302. The Zeromatic circuit receives the demodulated output from the AF amplifier 78 and a 5 KHz/12.5 KHz scan frequency width control signal from the CPU 56, and returns the output thereof as the Zeromatic signal to the CPU 56, functioning in the search mode.

The scanning radio receiver 11 has the capability to receive a plurality of reception objective radio wave signals the frequencies of which have been previously keyed into the keyboard 57 and memorized into the CPU 56 or in an external memory. The scanning radio receiver 11, in order to scan and receive reception objective radio wave signals, may be set to be automatically tune only to the frequencies on which actual audio signals exist, by using the squelch function.

Appendix 2 shows a program list as used in connection with the CPU 56, namely IC2 in FIG. 12. It explains in detail the operation of the scanning radio receiver 11.

While preferred embodiment of the present invention are shown and described, it is envisioned that those skilled in the art may devise various modifications of the present invention without departing from the spirit and scope of the appended claims.

The invention claimed is:

1. A scanning radio receiver comprising:

a CPU for controlling the operation of said scanning radio receiver, said CPU having programmable memory means for storing frequencies received by said scanning radio receiver, a keyboard, said CPU being connected to said keyboard, said keyboard providing for utilization of scan functions and inputting a frequency to be stored in said memory;

first mixing means for frequency-converting a reception objective radio wave signal with a first local frequency so that a first IF signal is provided;

second mixing means for frequency-converting said first IF signal with a second local frequency so that a second IF signal is provided;

a single PLL frequency synthesizer for generating said first local frequency, depending upon the frequency of said reception objective radio wave signal, and supplying said first local frequency to said first mixing means, and for generating said second local frequency, depending upon the frequency of said reception objective radio wave signal, and supplying said second local frequency to said second mixing means, said frequency synthesizer having first and second VCO means and at least one phase comparator, said first and second VCO means for providing said first and second local frequencies, respectively, on the basis of control from said at least one phase comparator, said at least one phase comparator comparing a common reference divider output to a stable frequency and a respective comparison divider output responsive to the respective VCO means output;

said single PLL frequency synthesizer receiving a data signal and a clock signal from said CPU corresponding to the frequency of said reception objective radio wave signal, said data signal including data relating to a divide value for a divider, data relating to the selection of a divider associating latch to be updated, and data relating to activation of phase comparators;

third mixing means for frequency-converting said second IF signal with a third local frequency which is a predetermined fixed frequency so that a third IF signal is provided;

FM demodulation means for reproducing an FM audio signal from said third IF signal when the modulation type of said reception objective radio wave signal is FM;

AM detection means for reproducing an AM audio signal from said third IF signal when the modulation type of said reception objective radio wave signal is AM; and AM/FM switching means for receiving said FM and AM audio signals and providing a selective audio signal in response to instruction from said CPU, said scanning radio receiver including a band-pass filter as a stage before said reception objective radio wave signal is mixed for frequency conversion in said fist mixing means, said band-pass filter having a plurality of band-pass filter portions each having an assigned pass-band, only one of which is activated by instruction from said CPU depending upon the frequency of said reception objective radio wave signal so that it is passed through the activated band pass filter portion of which passband covers the frequency of said reception objective radio wave signal, and said receiver including search means, said search means scanning for any available reception objective radio wave signals and storing any received reception objective radio wave signals into said memory means.

\* \* \* \* \*